US012787429B2

(12) United States Patent
Khan et al.

(10) Patent No.: US 12,787,429 B2
(45) Date of Patent: Nov. 3, 2026

(54) LATERAL PASSIVE DIODES CO-INTEGRATED WITH NANOSHEET TECHNOLOGY

(71) Applicant: International Business Machines Corporation, Armonk, NY (US)

(72) Inventors: Shahrukh Khan, Sandy Hook, CT (US); Biswanath Senapati, Mechanicville, NY (US); Utkarsh Bajpai, Delmar, NY (US); Chen Zhang, Santa Clara, CA (US); Huimei Zhou, Albany, NY (US); Junli Wang, Slingerlands, NY (US); Jay William Strane, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 391 days.

(21) Appl. No.: 18/531,038

(22) Filed: Dec. 6, 2023

(65) Prior Publication Data

US 2025/0194242 A1 Jun. 12, 2025

(51) Int. Cl.

| | |
|---|---|
| ***H01L 21/66*** | (2006.01) |
| ***H10D 30/01*** | (2025.01) |
| ***H10D 30/43*** | (2025.01) |
| ***H10D 30/67*** | (2025.01) |
| ***H10D 62/10*** | (2025.01) |
| ***H10D 62/13*** | (2025.01) |
| ***H10D 84/01*** | (2025.01) |
| ***H10D 84/03*** | (2025.01) |
| ***H10D 84/85*** | (2025.01) |
| ***H10D 88/00*** | (2025.01) |
| ***H10W 20/41*** | (2026.01) |

(52) U.S. Cl.

CPC ......... *H10D 84/856* (2025.01); *H10D 30/014* (2025.01); *H10D 30/43* (2025.01); *H10D 30/6729* (2025.01); *H10D 30/6735* (2025.01); *H10D 62/121* (2025.01); *H10D 62/151* (2025.01); *H10D 84/017* (2025.01); *H10D 84/0186* (2025.01); *H10D 84/038* (2025.01); *H10D 88/01* (2025.01); *H10W 20/427* (2026.01)

(58) Field of Classification Search

CPC .... H10D 84/856; H10D 30/014; H10D 30/43; H10D 30/6729; H10D 30/6735; H10D 62/121; H10D 62/151; H10D 84/017; H10D 84/0186; H10D 84/038; H10D 88/01; H10D 84/811; H10D 88/00; H10W 20/427

USPC .......................................................... 257/351

See application file for complete search history.

(56) References Cited

U.S. PATENT DOCUMENTS

| | | | | |
|---|---|---|---|---|
| 8,125,003 | B2 * | 2/2012 | Bhattacharyya ....... | H10D 86/01 365/159 |
| 9,006,087 | B2 | 4/2015 | Chang et al. | |
| 9,224,811 | B2 | 12/2015 | Cheng et al. | |
| 9,837,414 | B1 | 12/2017 | Balakrishnan et al. | |

(Continued)

*Primary Examiner* — Vu A Vu

(74) *Attorney, Agent, or Firm* — Scully, Scott, Murphy & Presser, P.C.; Samuel Waldbaum

(57) ABSTRACT

A semiconductor structure is provided that includes a lateral passive diode co-integrated with nanosheet stacked FET technology. Notably, the semiconductor structure includes a passive/diode device region including a lateral passive diode that is located between two nanosheet stacks. In embodiments, a logic device region including a stacked nanosheet transistor is located adjacent to the passive/diode device region.

17 Claims, 18 Drawing Sheets

(56) References Cited

U.S. PATENT DOCUMENTS

| | | | | |
|---|---|---|---|---|
| 9,847,391 | B1 | 12/2017 | Zang et al. | |
| 10,504,890 | B2 | 12/2019 | Cheng et al. | |
| 10,658,462 | B2 | 5/2020 | Lee et al. | |
| 10,748,994 | B2 | 8/2020 | Reznicek et al. | |
| 10,879,352 | B2 | 12/2020 | Zhang et al. | |
| 11,101,374 | B1 | 8/2021 | Reznicek et al. | |
| 11,121,044 | B2 | 9/2021 | Cheng et al. | |
| 11,569,223 | B2 | 1/2023 | Hung et al. | |
| 2018/0102359 | A1 | 4/2018 | Cheng et al. | |
| 2022/0045052 | A1 | 2/2022 | Huang et al. | |
| 2022/0415880 | A1 | 12/2022 | Kar et al. | |
| 2023/0069501 | A1 | 3/2023 | Yeh et al. | |
| 2023/0087444 | A1 | 3/2023 | Thomson et al. | |
| 2023/0110825 | A1* | 4/2023 | Zhou | H10D 8/045 257/351 |
| 2023/0275084 | A1* | 8/2023 | Hong | H10D 84/811 |
| 2024/0332282 | A1* | 10/2024 | Yu | H10D 89/711 |

* cited by examiner

LATERAL PASSIVE DIODES CO-INTEGRATED WITH NANOSHEET TECHNOLOGY

BACKGROUND

The present application relates to semiconductor technology, and more particularly to a semiconductor structure including a passive/diode device region including a lateral passive diode that is located between two nanosheet stacks.

In semiconductor device fabrication processes, a large number of devices, including field effect transistors (FETs), are fabricated on a single wafer. In addition to these devices, there is a need for other structures, such as diodes, that are formed from PN junctions. Being fabricated from similar materials, it is advantageous to be able to form both FETs and diodes onto a substrate by applying the same processes onto the same substrate and on the same layer, including nanosheet layers. In nanosheet-based transistors, in contrast to conventional planar FETs, the gate stack wraps around the full perimeter of each nanosheet, enabling fuller depletion in the channel region, and reducing short-channel effects due to steeper sub-threshold swing (SS) and smaller drain-induced barrier lowering (DIBL). Diodes fabricated from nanosheet structures also increase the PN junction area per footprint.

SUMMARY

A semiconductor structure is provided that includes a lateral passive diode co-integrated with nanosheet stacked FET technology. Notably, the semiconductor structure includes a passive/diode device region including a lateral passive diode that is located between two nanosheet stacks. In embodiments, a logic device region including a stacked nanosheet transistor is located adjacent to the passive/diode device region.

In one embodiment, the semiconductor structure includes a diode located in a passive/diode device region and present between two adjacent stacked nanosheet transistors, wherein the diode includes a first doped semiconductor pillar of a first conductivity type and a second doped semiconductor pillar of a second conductivity type that is opposite the first conductivity type, and an intrinsic semiconductor pillar laterally between the first doped semiconductor pillar and the second doped semiconductor pillar. The structure further includes a first backside contact structure contacting the first doped semiconductor pillar, and a second backside contact structure contacting the second doped semiconductor pillar.

In another embodiment, the semiconductor structure includes a diode located in a passive/diode device region and present between two adjacent stacked nanosheet transistors, wherein the diode includes a first doped semiconductor pillar of a first conductivity type sandwiched between a pair of second doped semiconductor pillars of a second conductivity type that is opposite the first conductivity type. The structure further includes a first backside contact structure contacting one of the second doped semiconductor pillars, a second backside contact structure contacting the other second doped semiconductor pillar, and a frontside contact structure contacting the first doped semiconductor pillar.

In yet another embodiment, the semiconductor structure includes a bottom diode located in a passive/diode device region and present between two adjacent stacked nanosheet transistors, wherein the bottom diode includes a first doped bottom semiconductor pillar of a first conductivity type and a second doped bottom semiconductor pillar of a second conductivity type that is opposite the first conductivity type, wherein the first doped bottom semiconductor pillar and the second doped bottom semiconductor pillar are in direct physical contact with each other. The structure further includes a top diode located above and spaced apart from the bottom diode, wherein the top diode includes a first doped top semiconductor pillar of the first conductivity type and a second doped top semiconductor pillar of the second conductivity type, wherein the first doped top semiconductor pillar and the second doped top semiconductor pillar are in direct physical contact with each other. The structure even further includes a first backside contact structure contacting the first doped bottom semiconductor pillar, a second backside contact structure contacting the second doped bottom semiconductor pillar, a first frontside contact structure contacting the first doped top semiconductor pillar, and a second frontside contact structure contacting the second doped top semiconductor pillar.

DETAILED DESCRIPTION

Figure 1B:
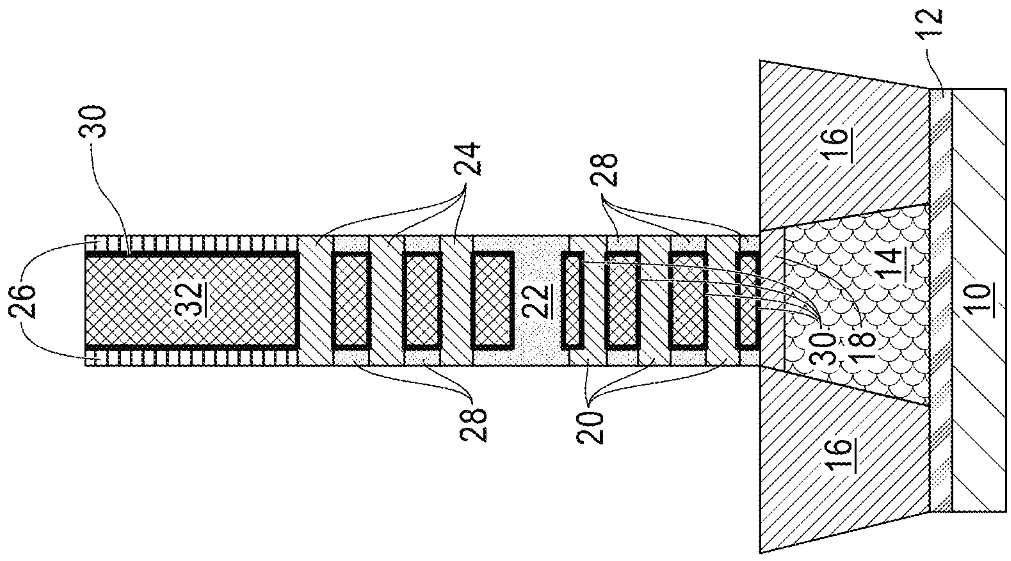
FIGS. 1A-1B are cross sectional views of a stacked nanosheet transistor including a top nanosheet transistor stacked on top of a bottom nanosheet transistor that is present on a surface of a substrate in each of a logic device region and a passive/diode device region, respectively.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

The terms substantially, substantially similar, about, or any other term denoting functionally equivalent similarities refer to instances in which the difference in length, height, or orientation convey no practical difference between the definite recitation (e.g. the phrase sans the substantially similar term), and the substantially similar variations. In one embodiment, substantial (and its derivatives) denote a difference by a generally accepted engineering or manufacturing tolerance for similar devices, up to, for example, 10% deviation in value or 10° deviation in angle.

In complementary metal oxide semiconductor (CMOS) architecture, the semiconductor substrate is blocked off to form vertically implanted junctions for diode devices. Semiconductor-on-insulator (SOI) like lateral diode structures are one possible solution, but for stacked FETs it is not easy to have both P and N epitaxial layers on the same level. For passive/diodes to have a bulk like function, it is required to have greater than 100 nm of remaining semiconductor material beneath the diode. In stacked nanosheet and non-stacked FET integration with a backside power distribution network, the backside semiconductor substrate is fully recessed and is thus not available for implanted junctions. There is a need to have co-integration of passive/diodes with nanosheet logic with tall N and P type junctions in the same level when no access to the backside semiconductor substrate is possible.

In the present application, a semiconductor structure is described and illustrated as containing stacked nanosheet transistors in both a logic device region and a passive/diode region. In a logic device region, a transistor (or FET)) includes a source region, a drain region, a semiconductor channel region located between the source region and the drain region, and a gate structure located above the semiconductor channel region. Collectively, the source region and the drain region can be referred to as a source/drain region. In the logic device region, a nanosheet transistor is a non-planar transistor that includes a vertical stack of spaced apart semiconductor channel material nanosheets as the semiconductor channel region with a pair of source/drain regions located at each of the ends of the vertical stack of spaced apart semiconductor channel material nanosheets. The gate structure includes a gate dielectric and a gate electrode. The gate structure wraps each of the spaced apart semiconductor channel material nanosheets. In the logic device region, a stacked transistor includes one nanosheet transistor containing source/drain regions stacked above another nanosheet transistor containing source/drain regions.

In the passive/diode device region, the stacked nanosheet transistor lacks the source/drain regions and instead includes a diode located at least one of the sidewalls of the stacked nanosheet transistors. The diode can include a P-i-N diode, a P—N—P diode or a N—P—N diode. In some embodiments, the diode is a singular diode that is present laterally adjacent to each of the stacked nanosheet transistors. In another embodiment, a bottom diode can be located laterally adjacent to a bottom nanosheet transistor of the stacked nanosheet transistor, and a top diode can be located laterally adjacent to a top nanosheet transistor of the stacked nanosheet transistor.

In the present application, the semiconductor structure includes a frontside and a backside. The frontside includes a side of the structure that includes the stacked nanosheet transistors, frontside contact structures, and a frontside BEOL structure. The backside of the semiconductor structure is the side of the device that is opposite the frontside. The backside includes a backside contact structures.

Figure 17B:
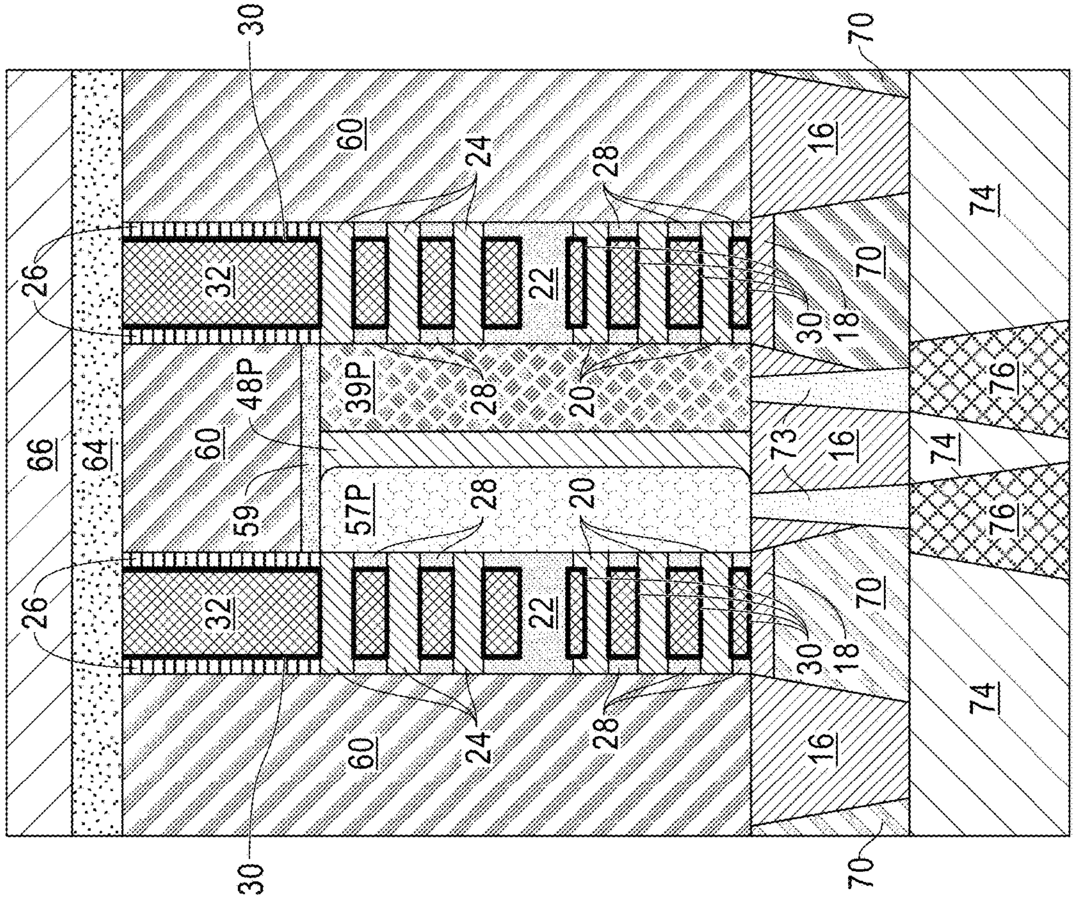
FIGS. 17A-17B are cross sectional views of the stacked nanosheet transistors shown in FIGS. 16A and 16B, respectively, after further backside processing.

In a first embodiment and as illustrated in FIG. 17B, the semiconductor structure includes a diode located in a passive/diode device region and present between two adjacent stacked nanosheet transistors, wherein the diode includes a first doped semiconductor pillar 39P of a first conductivity type and a second doped semiconductor pillar 57P of a second conductivity type that is opposite the first conductivity type, and an intrinsic semiconductor pillar 48P located laterally between the first doped semiconductor pillar 39P and the second doped semiconductor pillar 57P. The structure of this first embodiment further includes a first backside contact structure (i.e., backside contact structure 73 located in the right hand side of the drawing) contacting the first doped semiconductor pillar 39P, and a second backside contact structure (i.e., backside contact structure 73 located in the left hand side of the drawing) contacting the second doped semiconductor pillar 57P.

In some embodiments and in regard to this first embodiment, the first doped semiconductor pillar 39P directly contacts a sidewall of a first stacked nanosheet transistor of the two adjacent stacked nanosheet transistors, and the second doped semiconductor pillar 57P directly contacts a sidewall of a second stacked nanosheet transistor of the two adjacent stacked nanosheet transistors.

In some embodiments and in regard to this first embodiment, the diode has a height that is substantially equally to a topmost second semiconductor channel material nanosheet 24 of the two adjacent stacked nanosheet transistors.

In some embodiments and in regard to this first embodiment, the structure can further include a first backside metal structure (i.e., backside metal structure 76 on the right hand side of FIG. 17B) contacting the first backside contact structure (i.e., backside contact structure 73 located in the right hand side of FIG. 17B), and a second backside metal structure (i.e., backside metal structure 76 on the left hand side of FIG. 17B) contacting second backside contact structure (i.e., backside contact structure 73 located in the left hand side of FIG. 17B), wherein the first backside contact structure and the second backside contact structure are present in a first backside ILD layer 70, and the first backside metal structure and the second backside metal structure are present in a second backside ILD layer 74. In such a structure, the backside metal contact structures are electrically connected to the diode by the backside contact structures.

In some embodiments and in regard to this first embodiment, the diode including each of the first doped semiconductor pillar 39P, the intrinsic semiconductor pillar 48P and the second doped semiconductor pillar 57P lands on a surface of a shallow trench isolation structure 16.

In some embodiments and in regard to this first embodiment, the structure can further include a frontside BEOL structure 64 located on top of the two adjacent stacked nanosheet transistors.

In some embodiments and in regard to this first embodiment, the structure can further include at least one other stacked nanosheet transistor located in a logic device region (See FIG. 17A) that is adjacent to the passive/diode device (See FIG. 17B), wherein the at least one other stacked nanosheet transistor includes a bottom nanosheet transistor having bottom source/drain regions 38 of the first conductivity type, and a top nanosheet transistor located above the bottom nanosheet transistor and having top source/drain regions 56 of the second conductivity type.

In some embodiments and in regard to this first embodiment, the top source/drain regions 56 are spaced apart from the bottom source/drain regions 38 by at least a S/D block mask 42. The S/D block mask 42 ensures that the stacked source/drain regions are electrically isolated from one another.

In some embodiments and in regard to this first embodiment, the structure can further include a frontside top S/D contact structure 62 contacting each of the top source/drain regions 56, and a backside bottom S/D contact structure 72 contacting each of the bottom source/drain regions 38. In such a structure, the stacked nanosheet transistor in the logic device region is wired on both the frontside and on the backside.

Figure 18:
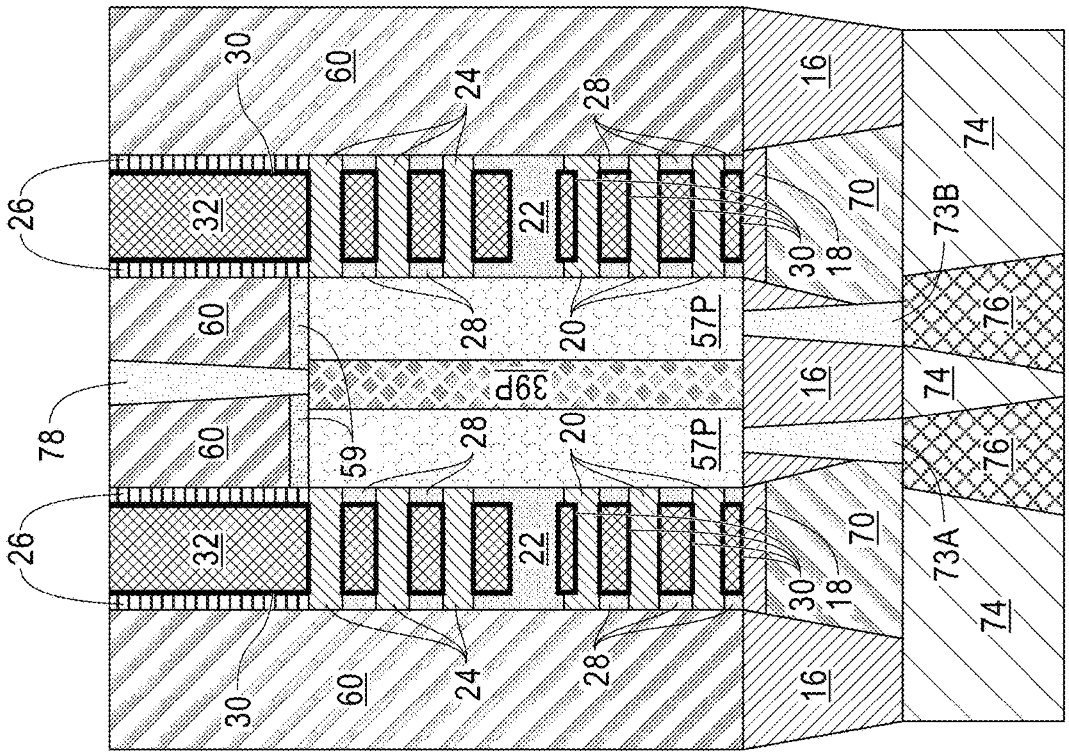
FIG. 18 is a cross sectional view of a semiconductor structure in accordance with another embodiment illustrating only the passive/diode device region.

In a second embodiment and as shown in FIG. 18, the semiconductor structure includes a diode located in a passive/diode device region and present between two adjacent stacked nanosheet transistors, wherein the diode includes a first doped semiconductor pillar 39 of a first conductivity type sandwiched between a pair of second doped semiconductor pillars 57P of a second conductivity type that is opposite the first conductivity type. The structure further includes a first backside contact structure 73A contacting one of the second doped semiconductor pillars 57B, a second backside contact structure 73B contacting the other second doped semiconductor pillar 57P, and a frontside contact structure 78 contacting the first doped semiconductor pillar 39P.

In some embodiments and in regard to this second embodiment, one of the second doped semiconductor pillars directly contacts a sidewall of a first stacked nanosheet transistor of the two adjacent stacked nanosheet transistors, and another of the second doped semiconductor pillars directly contacts a sidewall of a second stacked nanosheet transistor of the two adjacent stacked nanosheet transistors.

In some embodiments and in regard to this second embodiment, the diode has a height that is substantially equally to a topmost second semiconductor channel material nanosheet 24 of the two adjacent stacked nanosheet transistors.

In some embodiments and in regard to this second embodiment, the structure can further include a first backside metal structure 76 contacting the first backside contact structure 73A, and a second backside metal structure 76 contacting second backside contact structure 73B, wherein the first backside contact structure 73A and the second backside contact structure 73B are present in a first backside ILD layer 70, and the first backside metal structure and the second backside metal structure are present in a second backside ILD layer 74.

In some embodiments and in regard to this second embodiment, the diode including each of the first doped semiconductor pillar 39P, and the pair of second doped semiconductor pillars 57P lands on a surface of a shallow trench isolation structure 16.

In some embodiments and in regard to this second embodiment, the structure can further include a frontside BEOL structure (not shown in FIG. 18, but readily apparent from FIG. 17B) located on top of the two adjacent stacked nanosheet transistors.

In some embodiments and in regard to this second embodiment, the structure can further include at least one other stacked nanosheet transistor (See, for example, FIG. 17A) located in a logic device region that is adjacent to the passive/diode device, wherein the at least one other stacked nanosheet transistor includes a bottom nanosheet transistor having bottom source/drain regions, and a top nanosheet transistor located above the bottom nanosheet transistor and having top source/drain regions.

Figure 19:
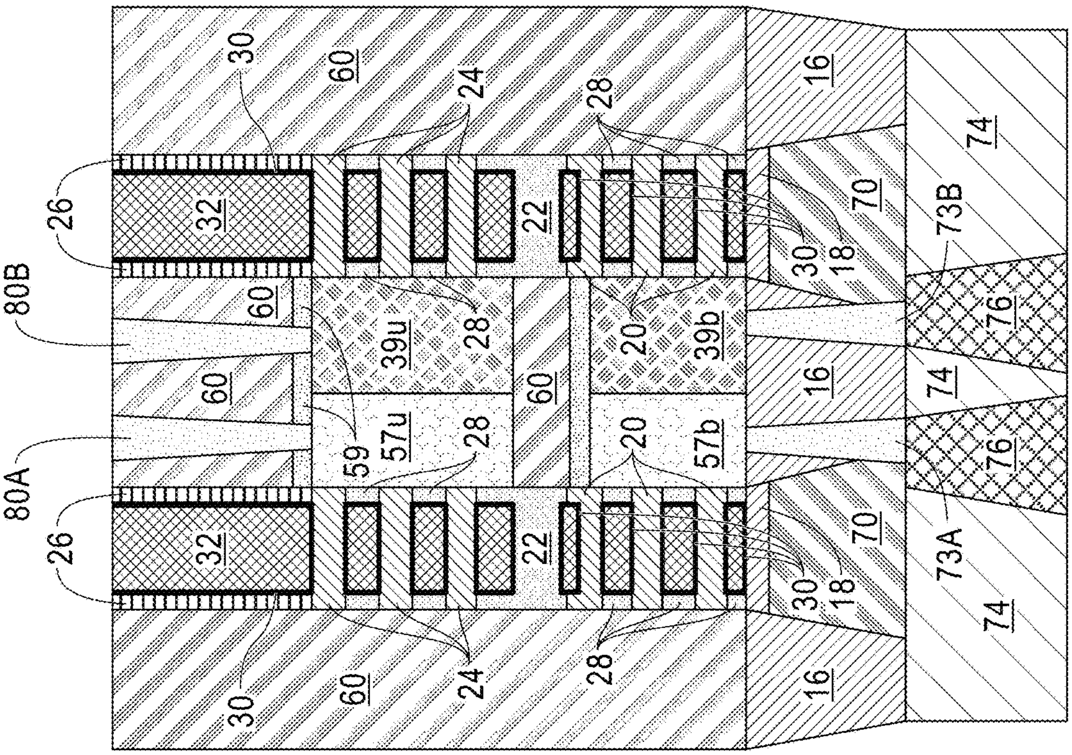
FIG. 19 is a cross sectional view of a semiconductor structure in accordance with yet another embodiment illustrating only the passive/diode device region.

In third embodiment and as is shown in FIG. 19, the semiconductor structure includes a bottom diode located in a passive/diode device region and present between two adjacent stacked nanosheet transistors, wherein the bottom diode includes a first doped bottom semiconductor pillar 39*b* of a first conductivity type and a second doped bottom semiconductor pillar 57*b* of a second conductivity type that is opposite the first conductivity type, wherein the first doped bottom semiconductor pillar 39*b* and the second doped bottom semiconductor pillar 57*b* are in direct physical contact with each other; a top diode located above and spaced apart from the bottom diode, wherein the top diode includes a first doped top semiconductor pillar 39*u* of the first conductivity type and a second doped top semiconductor pillar 57*u* of the second conductivity type, wherein the first doped top semiconductor pillar 39*u* and the second doped top semiconductor pillar 57*u* are in direct physical contact with each other. The structure illustrated in FIG. 19 further includes a first backside contact structure 73B contacting the first doped bottom semiconductor pillar 39*b*; a second backside contact structure 73A contacting the second doped bottom semiconductor pillar 57*b*; a first frontside contact structure 80B contacting the first doped top semiconductor pillar 39*u*; and a second frontside contact structure 80A contacting the second doped top semiconductor pillar 57*u*.

In some embodiments and in regard to this third embodiment, the bottom diode is located laterally adjacent to a bottom nanosheet transistor of each of the two adjacent stacked nanosheet transistors, and the top diode is located laterally adjacent to a top nanosheet transistor of each of the two adjacent stacked nanosheet transistors.

In some embodiments and in regard to this third embodiment, the bottom diode including the first doped bottom semiconductor pillar 39*b* and the second doped bottom semiconductor pillar 57*b* lands on a surface of a shallow trench isolation structure 16.

In some embodiments and in regard to this third embodiment, the structure can further include a first backside metal structure 76 contacting the first backside contact structure 73B, and a second backside metal structure 76 contacting second backside contact structure 73A, wherein the first backside contact structure 73B and the second backside contact structure 73A are present in a first backside ILD layer 70, and the first backside metal structure and the second backside metal structure are present in a second backside ILD layer 74.

Figure 1A:
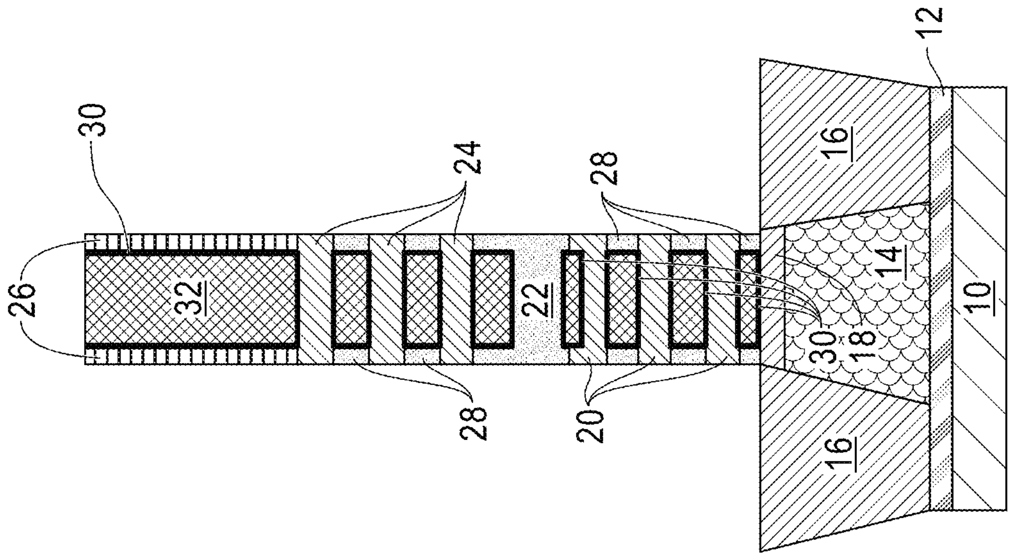

These and other aspect of the three embodiments mentioned above will now be described in greater detail. Referring first to FIGS. 1A-1B, there are illustrated a stacked nanosheet transistor including a top nanosheet transistor stacked on top of a bottom nanosheet transistor that is present on a surface of a substrate in each of a logic device region and a passive/diode device region. In the present application, FIGS. 1A-17A shown the stacked nanosheet transistor that is present in the logic device region, while FIGS. 1B-17B, 18 and 19 shown the stacked nanosheet transistor that is present in the passive/diode device region. In the present application, these two device regions are integrated on the same substrate. It is noted that at this point of the present application the stacked nanosheet transistor that is formed in the logic device region lacks the source/drain region and stacked nanosheet transistor in the passive/diode device region lacks the diode. It is also noted that although each of the logic device region and the passive/diode device region shown in FIGS. 1A and 1B, respectively, is illustrated as containing a single stacked nanosheet transistor, a plurality of stacked nanosheet transistors can be formed in each of the logic device region and the passive/diode device region.

The stacked nanosheet transistor that is present in each of the logic device region and the passive/diode device region is the same at this point of the present application. Notably, each stacked nanosheet transistor includes a top (or second) nanosheet transistor located on top of a bottom (or first) nanosheet transistor. The bottom nanosheet transistor includes a plurality of spaced apart and vertically stacked first semiconductor channel material nanosheets 20, and a bottom gate structure wrapped around each of the plurality of spaced apart and vertically stacked first semiconductor channel material nanosheets 20. The top nanosheet transistor includes a plurality of spaced apart and vertically stacked second semiconductor channel material nanosheets 24, and a top gate structure wrapped around each of the plurality of spaced apart and vertically stacked second semiconductor channel material nanosheets 24.

The bottom gate structure includes a first gate dielectric layer and a first gate electrode. The top gate structure includes a second gate dielectric layer and a second gate electrode. In some embodiments, and as illustrated in the drawings, the first gate dielectric layer and the second first gate dielectric layer are composed of a compositionally same gate dielectric material, and the first gate electrode and the second gate electrode are composed of compositionally same gate electrode material. In such an embodiment, the top and bottom gate structures are composed of the same materials and includes gate dielectric layer 30 and gate electrode 32 as is illustrated in FIGS. 1A and 1B. In other embodiments, not illustrated the first gate dielectric layer and the second first gate dielectric layer can be composed of a compositionally different gate dielectric material, and the first gate electrode and the second gate electrode can be composed of a compositionally different gate electrode material. Other embodiments exist in which only the first gate electrode and the second gate electrode are composed of a compositionally different gate electrode material.

In the present application, the term "gate dielectric material" denotes a dielectric material that is associated with a gate structure and which is in contact with a channel region of the transistor. The gate dielectric material typically has a dielectric constant of greater than 4.0; all dielectric constants mentioned in this application are measured in a vacuum unless otherwise stated. Illustrative examples of gate dielectric materials that can be used in the present application include, but are not limited to, hafnium dioxide ($HfO_2$), hafnium silicon oxide (HfSiO), hafnium silicon oxynitride (HfSiO), lanthanum oxide ($La_2O_3$), lanthanum aluminum oxide ($LaAlO_3$), zirconium dioxide ($ZrO_2$), zirconium silicon oxide ($ZrSiO_4$), zirconium silicon oxynitride ($ZrSiO_xN_y$), tantalum oxide ($TaO_x$), titanium oxide (TiO), barium strontium titanium oxide ($BaO_6SrTi_2$), barium titanium oxide ($BaTiO_3$), strontium titanium oxide ($SrTiO_3$), yttrium oxide ($Yb_2O_3$), aluminum oxide ($Al_2O_3$), lead scandium tantalum oxide ($Pb(Sc,Ta)O_3$), and/or lead zinc niobite (Pb(Zn,Nb)O). The gate dielectric material can further include dopants such as lanthanum (La), aluminum (Al) and/or magnesium (Mg).

In the present application, the term "gate electrode material" denotes a conductive material that is associated with a gate structure and which is in contact with the gate dielectric material. In the present application, the gate electrode material can include a work function metal (WFM) and optionally a conductive metal. The WFM can be used to set a threshold voltage of the transistor to a desired value. In some embodiments, the WFM can be selected to effectuate an n-type threshold voltage shift. "N-type threshold voltage shift" as used herein means a shift in the effective work-function of the work-function metal-containing material towards a conduction band of silicon in a silicon-containing material. In one embodiment, the work function of the n-type work function metal ranges from 4.1 eV to 4.3 eV. Examples of such materials that can effectuate an n-type threshold voltage shift include, but are not limited to, titanium aluminum, titanium aluminum carbide, tantalum nitride, titanium nitride, hafnium nitride, hafnium silicon, or combinations and thereof. In other embodiments, the WFM can be selected to effectuate a p-type threshold voltage shift. In one embodiment, the work function of the p-type work function metal ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the effective work-function of the work-function metal-containing material towards a valence band of silicon in the silicon containing material. Examples of such materials that can effectuate a p-type threshold voltage shift include, but are not limited to, titanium nitride, and tantalum carbide, hafnium carbide, and combinations thereof. The optional conductive metal can include, but is not limited to aluminum (Al), tungsten (W), or cobalt (Co).

The bottom nanosheet transistor is located on a bottom dielectric isolation layer 18, and a middle dielectric isolation layer 22 separates the top nanosheet transistor from the bottom nanosheet transistor. In the present application, the bottom dielectric isolation layer 18 is located on a surface of a substrate. In one embodiment, and as is illustrated in FIGS. 1A-1B, the substrate can include a first semiconductor layer 10, an etch stop layer 12 and a second semiconductor layer 14. In embodiments, the first semiconductor layer 10 and/or the etch stop layer 12 can be omitted from the substrate. The substrate can also include a shallow trench isolation structure 16 formed in an upper portion thereof. In the illustrated embodiment shown in FIGS. 1A-1B and by way of one example, the shallow trench isolation structure 16 can be formed in the second semiconductor layer 14. Each stacked nanosheet transistor also includes inner spacers 28 and an upper gate spacer 26.

The stacked nanosheet transistors that are illustrated in FIGS. 1A-1B can be formed utilizing any well-known stacked nanosheet transistor formation technique. So as not to obscure the method of present application, the technique used in forming the stacked nanosheet transistors that are illustrated in FIGS. 1A-1B are not provided herein. Each of the components illustrated in FIGS. 1A-1B and that were previously mentioned above will now be described in greater detail.

The first semiconductor layer 10 is composed of a first semiconductor material, and the second semiconductor layer 14 is composed of a second semiconductor material. The term "semiconductor material" is used throughout the present application to denote a material having semiconducting properties. Examples of semiconductor materials that can be used in the present application in providing the first semiconductor material and the second semiconductor material include, but are not limited to, silicon (Si), a silicon germanium (SiGe) alloy, a silicon germanium carbide (SiGeC) alloy, germanium (Ge), III/V compound semiconductors or II/VI compound semiconductors. The second semiconductor material that provides the second semiconductor layer 14 can be compositionally the same as, or compositionally different from, the first semiconductor material that provides the first semiconductor layer 10.

In some embodiments of the present application, the etch stop layer 12 can be composed of a dielectric material such as, for example, silicon dioxide and/or boron nitride. In other embodiments of the present application, the etch stop layer 12 is composed of a semiconductor material that is compositionally different from the first semiconductor material that provides the first semiconductor layer 10 and the second semiconductor material that provides the second semiconductor layer 14. In one example, the first semiconductor layer 10 is composed of silicon, the etch stop layer 12 is composed of silicon dioxide, and the second semiconductor layer 14 is composed of silicon. In another example, the first semiconductor layer 10 is composed of silicon, the etch stop layer 12 is composed of silicon germanium, and the second semiconductor layer 14 is composed of silicon.

The substrate including the first semiconductor layer 10, the etch stop layer 12 and the second semiconductor layer 14 can be formed utilizing techniques well known to those skilled in the art. For example, the substrate including the first semiconductor layer 10, the etch stop layer 12 and the second semiconductor layer 14 can be formed by a separation by ion implantation of oxygen process, or wafer bonding. Alternatively, the substrate including the first semiconductor layer 10, the etch stop layer 12 and the second semiconductor layer 14 can be formed by deposition of the various substrate layers one on top the other. The deposition used in forming the various substrate layers can include, but is not limited to, chemical vapor deposition (CVD), plasma enhanced chemical vapor deposition (PECVD), or epitaxial growth. The terms "epitaxial growth" or "epitaxially growing" means the growth of a semiconductor material on a growth surface of another semiconductor material, in which the semiconductor material being grown has the same crystalline characteristics as the growth surface of the another semiconductor material. In an epitaxial deposition process, the chemical reactants provided by the source gases are controlled and the system parameters are set so that the depositing atoms arrive at the growth surface of the another semiconductor material with sufficient energy to move around on the growth surface and orient themselves to the crystal arrangement of the atoms of the growth surface. Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking.

The shallow trench isolation structure 16 is composed of a trench dielectric material such as, for example, silicon oxide. In some embodiments, a trench dielectric liner composed of, for example, SiN, can be present along a sidewall and a bottom wall of the trench dielectric material. The shallow trench isolation structure 16 has a topmost surface that is substantially coplanar with, or slightly below or above, a topmost surface of the bottom dielectric isolation layer 18.

The first semiconductor channel material nanosheets 20 are composed of a third semiconductor material. In some embodiments, the third semiconductor material that provides each first semiconductor channel material nanosheet 20 can provide high channel mobility for NFET devices. In other embodiments, the third semiconductor material that provides each first semiconductor channel material nanosheet 20 can provide high channel mobility for PFET devices. The number of first semiconductor channel material nanosheets 20 can vary also long as at least two first semiconductor channel material nanosheets 20 are present.

The second semiconductor channel material nanosheets 24 are composed of a fourth semiconductor material. The fourth semiconductor material can be compositionally the same as, or compositionally different from, the third semiconductor material mentioned above. In some embodiments, the fourth semiconductor material that provides each second semiconductor channel material nanosheet 24 can provide high channel mobility for NFET devices. In other embodiments, the fourth semiconductor material that provides each second semiconductor channel material nanosheet 24 can provide high channel mobility for PFET devices. The number of second semiconductor channel material nanosheets 24 can vary also long as at least two second semiconductor channel material nanosheets 24 are present.

The bottom dielectric isolation layer 18, the middle dielectric isolation layer 22, the inner spacers 28 and the gate spacer 26 are each composed of a spacer dielectric material. The spacer dielectric material that provides each of the bottom dielectric isolation layer 18, the middle dielectric isolation layer 22, the inner spacers 28 and the gate spacer 26 can include, but is not limited to, silicon dioxide, SiN, SiBCN, SiOCN or SiOC. In some embodiments, a compositionally same spacer dielectric material is used in providing at least the bottom dielectric isolation layer 18, the middle dielectric isolation layer 22 and the inner spacer 28.

Figure 2B:
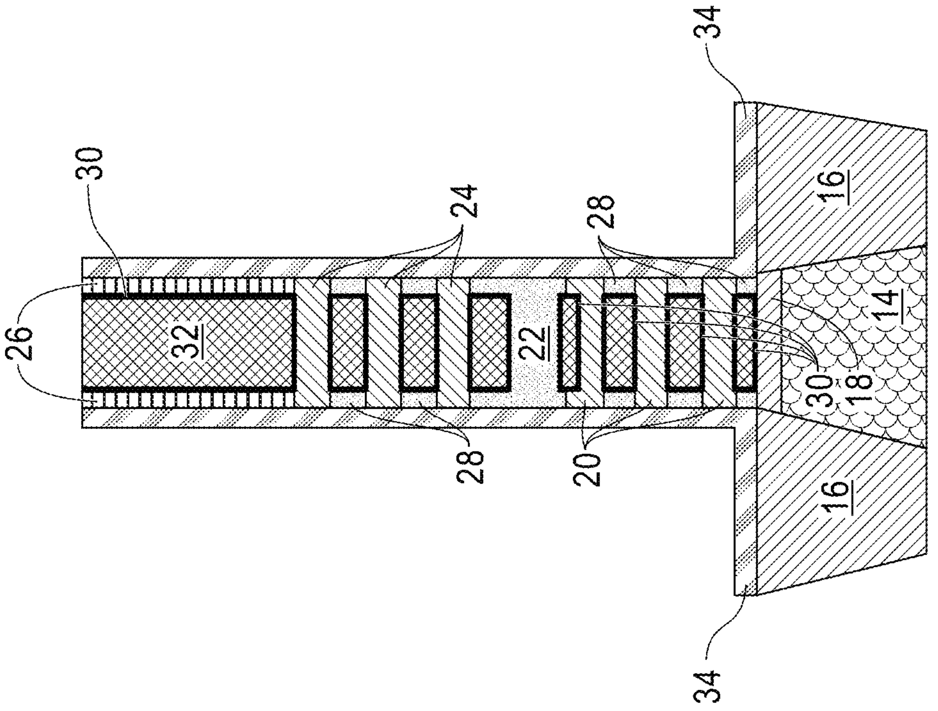
FIGS. 2A-2B are cross sectional views of the stacked nanosheet transistors shown in FIGS. 1A and 1B, respectively, after forming a first dielectric liner in each of the logic device region and the passive/diode device region.
Figure 2A:
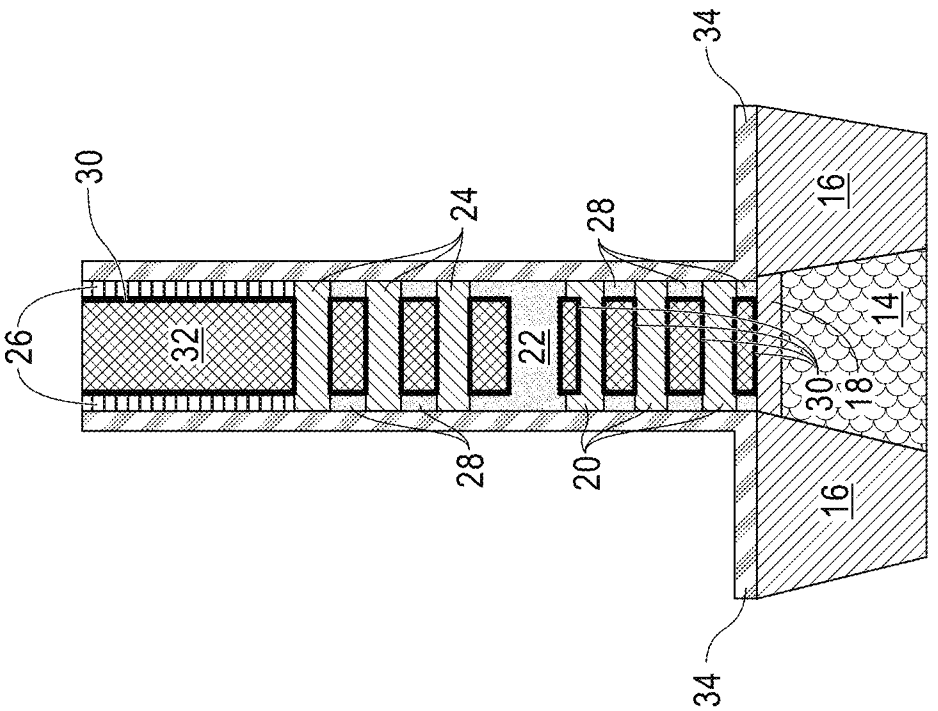

Referring now to FIGS. 2A-2B, there illustrated the stacked nanosheet transistors shown in FIGS. 1A and 1B, respectively, after forming a first dielectric liner 34 in each of the logic device region and the passive/diode device region. It is noted in FIGS. 2A-15B, the first semiconductor layer 10 and the etch stop layer 12 of the substrate are not shown for clarity. The first dielectric liner 34 is composed of a dielectric material that compositionally different from the trench dielectric material and the spacer dielectric material mentioned above. The dielectric material that provides the first dielectric liner 34 can include, for example, silicon oxide, silicon nitride or silicon oxynitride. The first dielectric liner 34 can be a conformal layer. The term 'conformal" denotes that a layer has a same thickness as measured from a horizontal surface of another layer as a thickness as measured from a vertical surface of the another layer. The first dielectric liner 34 can be formed by a deposition process such as, for example, CVD, PECVD, or atomic layer deposition (ALD). The first dielectric liner 34 is formed an entirety of each sidewall of the stacked nanosheet sheet transistors that are present in the logic device region and the passive/diode device region.

Figure 3A:
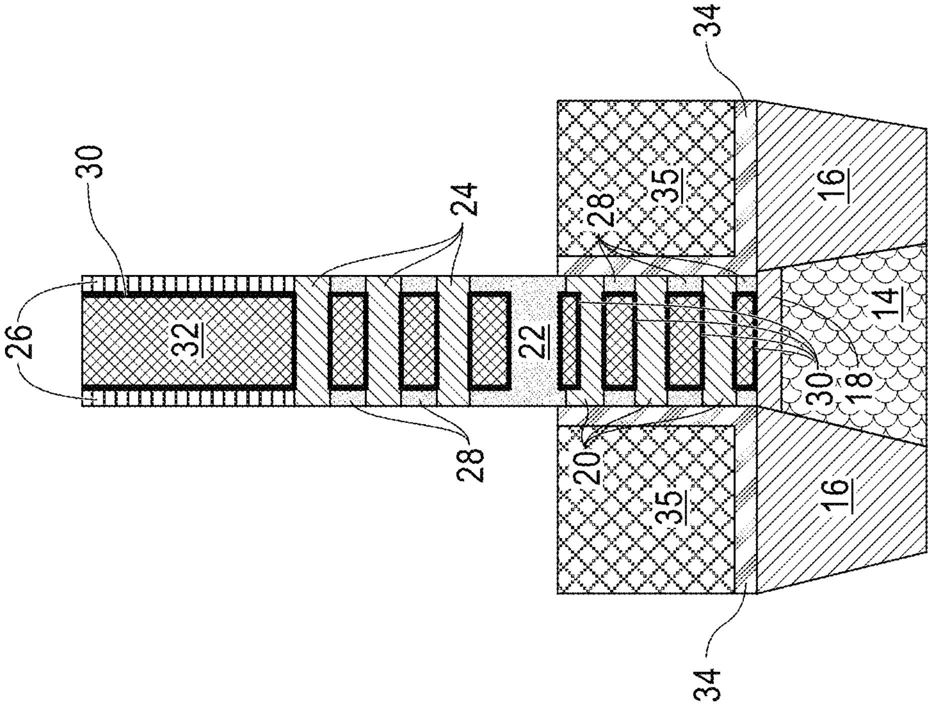
FIGS. 3A-3B are cross sectional views of the stacked nanosheet transistors shown in FIGS. 2A and 2B, respectively, after forming a masking structure in each of the logic device region and the passive/diode region, and recessing the first dielectric liner in each of the logic device region and the passive/diode device region.
Figure 3B:
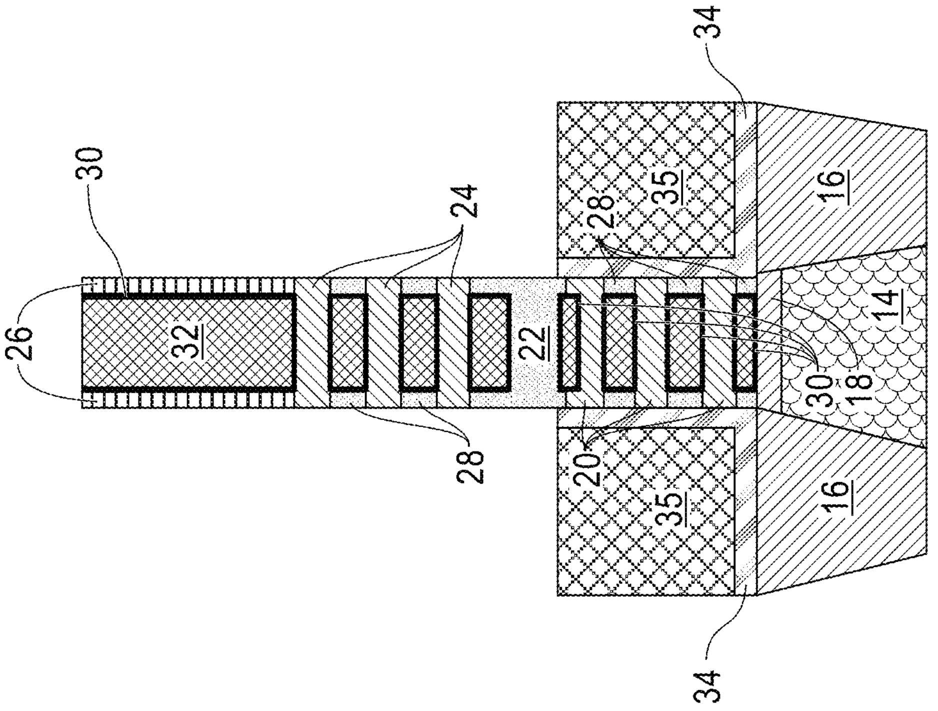

Referring now to FIGS. 3A-3B, there are illustrated the stacked nanosheet transistors shown in FIGS. 2A and 2B, respectively, after forming a masking structure 35 in each of the logic device region and the passive/diode region, and recessing the first dielectric liner 34 in each of the logic device region and the passive/diode device region. The masking structure 35 is formed adjacent to the bottom nanosheet transistor and has a topmost surface that does not extend above a topmost surface of the middle dielectric isolation layer 22. The masking structure 35 can be composed of any masking material such as, for example, a silicon dioxide that is formed from spin-on-glass. The masking structure 35 can be formed by deposition of the masking material, followed by a recess etch that is selective in etching the masking material. With masking structure 35 in place, the first dielectric liner 34 that is adjacent to the top nanosheet transistor is removed utilizing a recess etch that is selective in removing the dielectric material that provides the first dielectric liner 34.

Figure 4B:
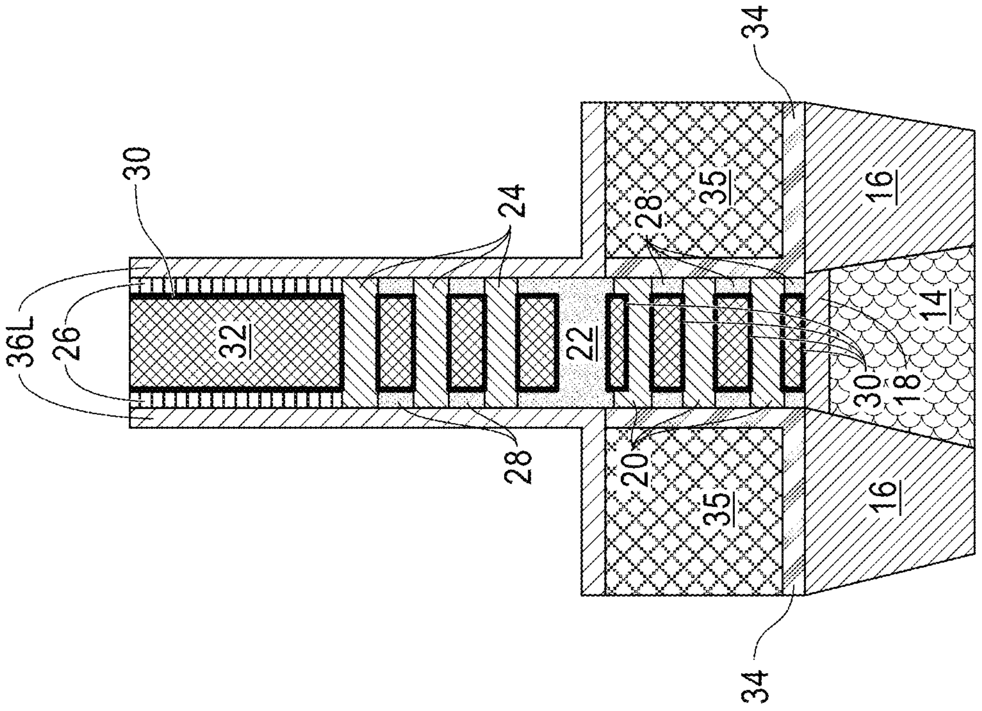
FIGS. 4A-4B are cross sectional views of the stacked nanosheet transistors shown in FIGS. 3A and 3B, respectively, after forming a second dielectric liner in each of the logic device region and the passive/diode device region.
Figure 4A:
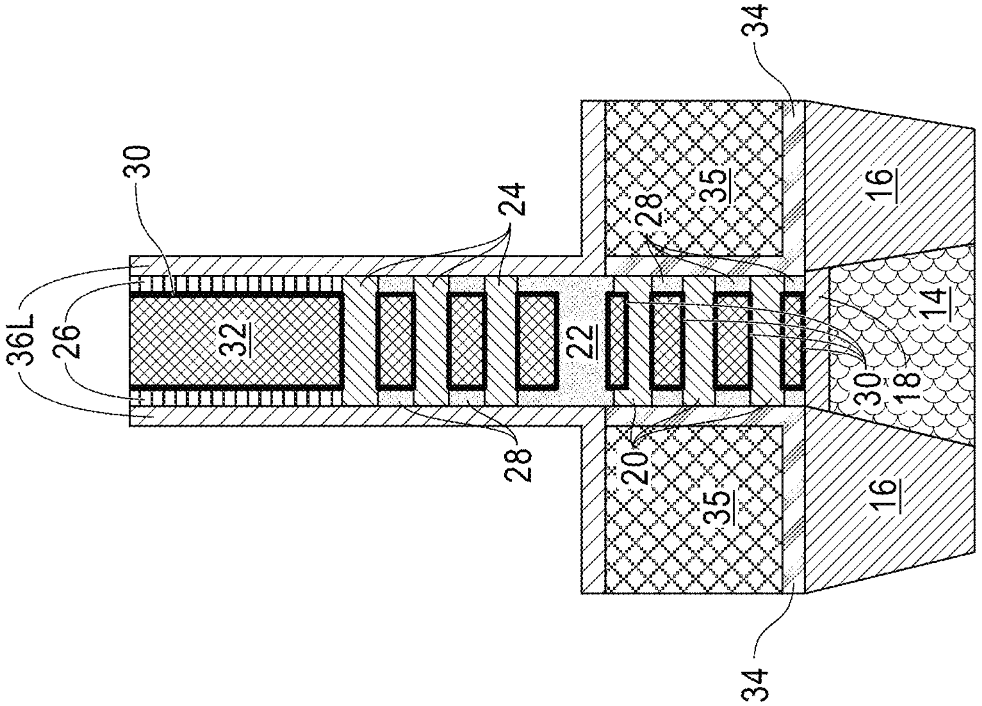

Referring now to FIGS. 4A-4B, there are illustrated the stacked nanosheet transistors shown in FIGS. 3A and 3B, respectively, after forming a second dielectric liner 36L in each of the logic device region and the passive/diode device region. The second dielectric liner 36L is composed of a dielectric material that compositionally different from dielectric material that provides the first dielectric liner 34 and the spacer dielectric material that provides the gate spacer 26. The dielectric material that provides the second dielectric liner 36L can include, for example, silicon oxide, silicon nitride or silicon oxynitride. In one embodiment, the first dielectric liner 34 is composed of silicon oxide and the second dielectric liner 36L is composed of silicon nitride. The second dielectric liner 36L can be a conformal layer. The second dielectric liner 36L can be formed by a deposition process such as, for example, CVD, PECVD, or atomic layer deposition (ALD). The second dielectric liner 36L is formed laterally adjacent to the top nanosheet transistor and on a physically exposed surface of the masking structure 35.

Figure 5A:
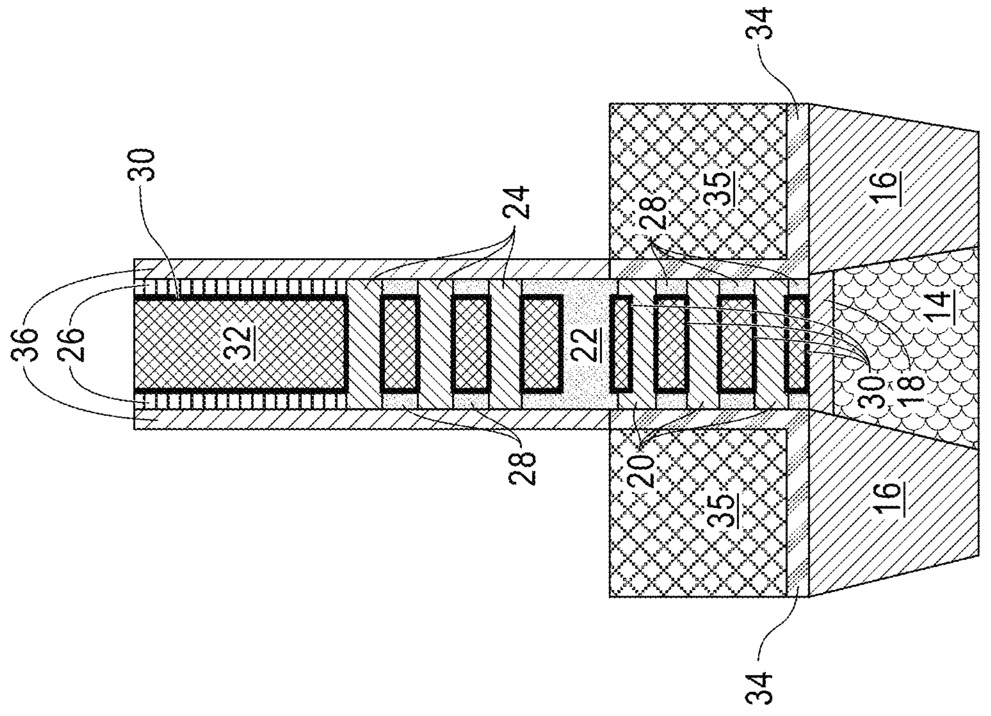
FIGS. 5A-5B are cross sectional views of the stacked nanosheet transistors shown in FIGS. 4A and 4B, respectively, after performing a spacer etch back process that converts the second dielectric liner in each of the logic device region and the passive/diode device region to a protective dielectric spacer.
Figure 5B:
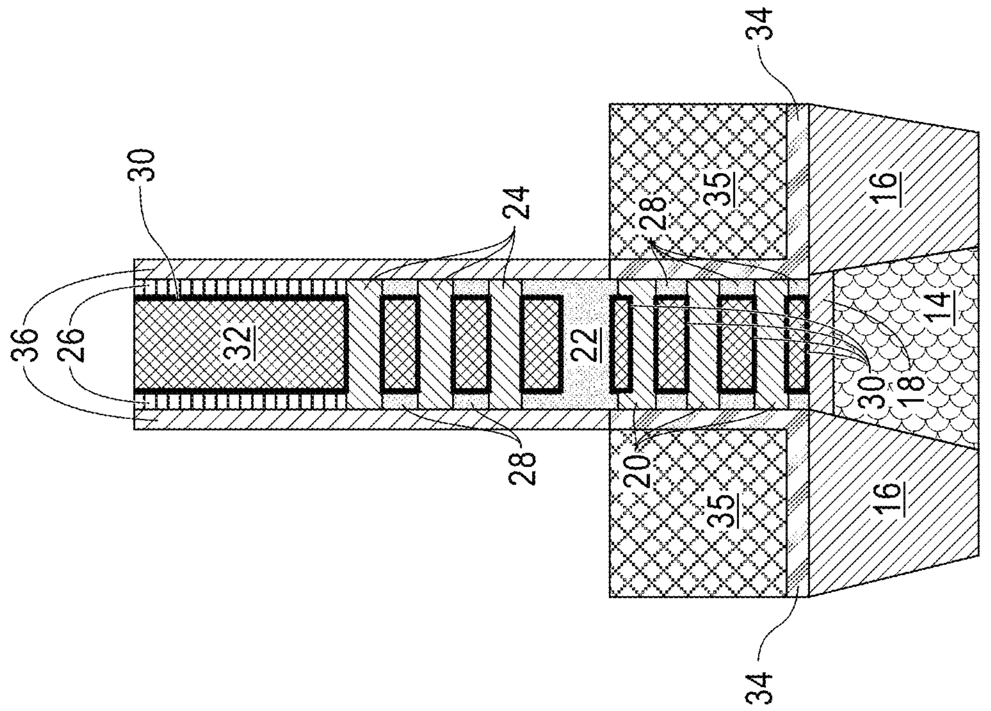

Referring now to FIGS. 5A-5B, there are illustrated the stacked nanosheet transistors shown in FIGS. 4A and 4B, respectively, after performing a spacer etch back process that converts the second dielectric liner 36L in each of the logic device region and the passive/diode device region to a protective dielectric spacer 36. The spacer etch back process is selective in removing the second dielectric liner 36L from all horizontal surfaces of the structure. The protective dielectric spacer 36 is formed along an entirety of the sidewalls of the top nanosheet transistor and at least a portion thereof lands on the remaining (i.e., recessed) first dielectric liner 34 that is present along the sidewalls of the bottom nanosheet transistor.

Figure 6B:
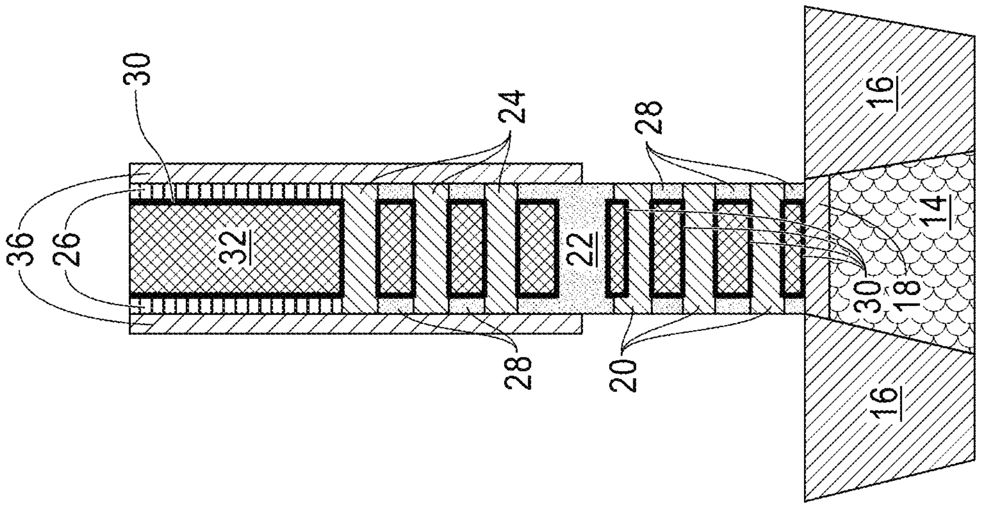
FIGS. 6A-6B are cross sectional views of the stacked nanosheet transistors shown in FIGS. 5A and 5B, respectively, after removing the masking structure and the recessed first dielectric liner from each of the logic device region and the passive/diode device region to reveal the bottom nanosheet transistor of the stacked nanosheet transistor.
Figure 6A:
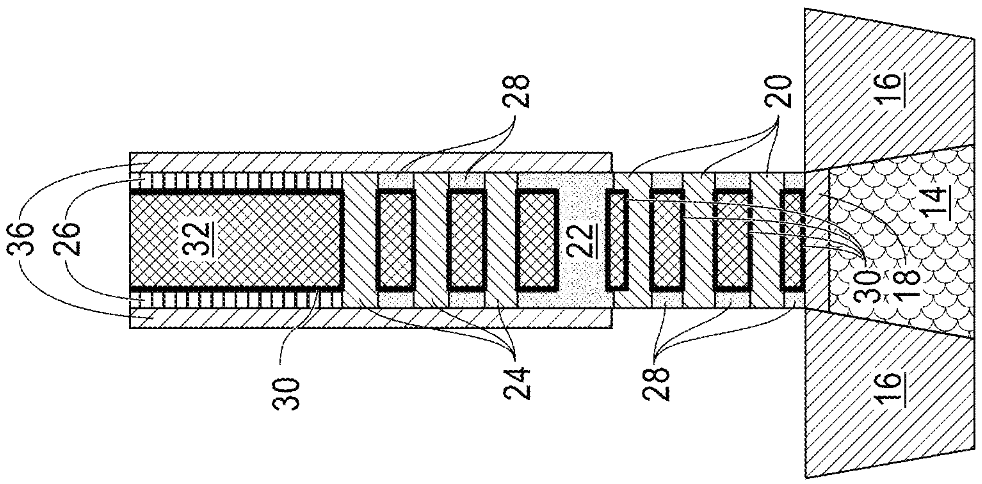

Referring now to FIGS. 6A-6B, there are illustrated the stacked nanosheet transistors shown in FIGS. 5A and 5B, respectively, after removing the masking structure 35 and the recessed first dielectric liner 34 from each of the logic device region and the passive/diode device region to reveal the bottom nanosheet transistor of the stacked nanosheet transistor. The masking structure 35 can be removed utilizing a material removal process that is selective in removing the masking material that provides the masking structure 35. In one example, an etch is used to remove the masking structure 35. The removal of the masking structure 35 reveals the recessed first dielectric liner 34 that is present adjacent to the bottom nanosheet transistor and on the shallow trench isolation structure 16. The recessed first dielectric liner 34 can be removed utilizing a material removal process such as an etch that is selective in removing the dielectric material that provides the first dielectric liner 34. Since the protective dielectric spacer 36 is composed of a compositionally different dielectric material that the first dielectric liner 34, the protective dielectric spacer 36 is not affected by the removal of the recessed first dielectric liner 34. The removal of the recessed first dielectric liner 34 reveals the bottom nanosheet transistor in each of the logic device region and the passive/diode device region; the top nanosheet transistor is protected by the protective dielectric spacer 36.

Figure 7B:
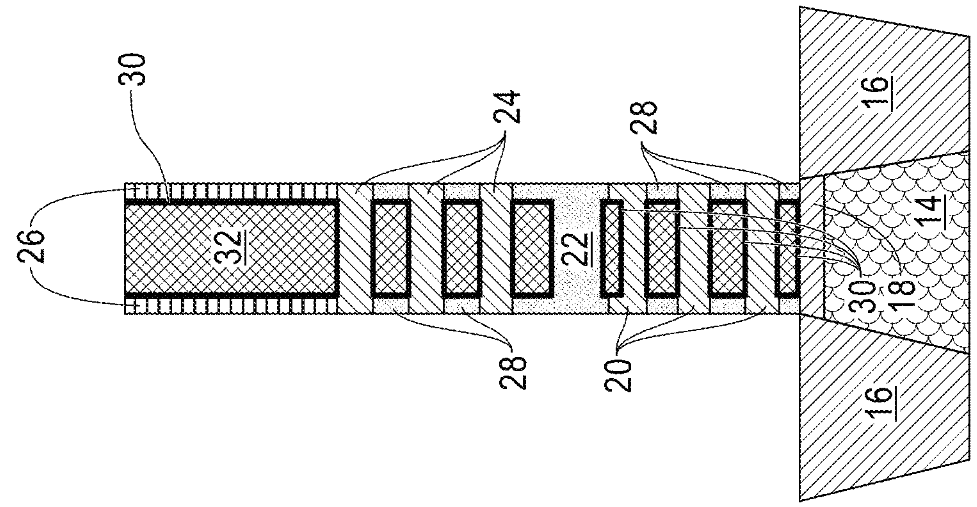
FIGS. 7A-7B are cross sectional views of the stacked nanosheet transistors shown in FIGS. 6A and 6B, respectively, after forming a first block mask in the logic device region, but not the passive/diode device region, and removing the protective dielectric spacer from the top nanosheet transistor of the stacked nanosheet transistor in the passive/diode device region.
Figure 7A:
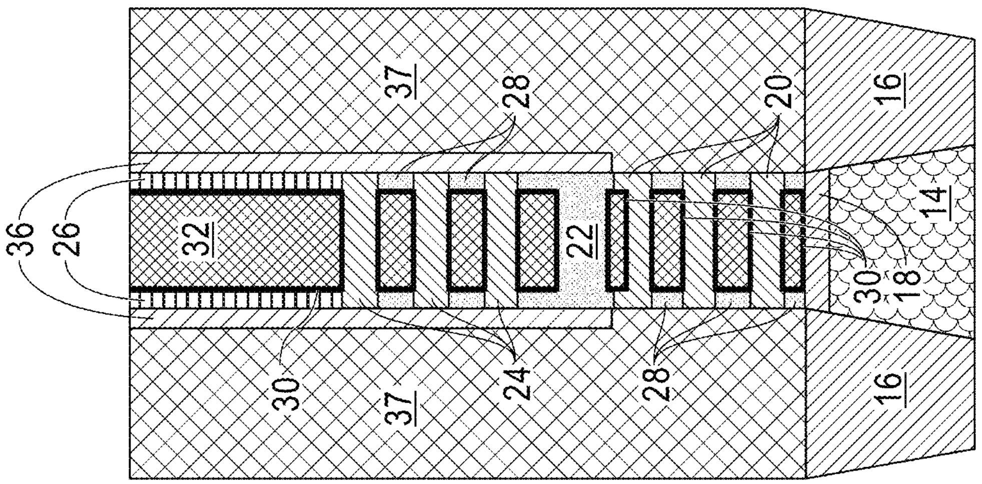

Referring now to FIGS. 7A-7B, there are illustrated the stacked nanosheet transistors shown in FIGS. 6A and 6B, respectively, after forming a first block mask 37 in the logic device region, but not the passive/diode device region, and removing the protective dielectric spacer 36 from the top nanosheet transistor of the stacked nanosheet transistor in the passive/diode device region. The first block mask 37 is composed of a first block mask material, and the first block mask 37 can be formed by deposition and lithographic patterning. With the first block mask 37 in place, the protective dielectric spacer 36 from the top nanosheet transistor of the stacked nanosheet transistor in the passive/diode device region is removed utilizing a material removal process such as an etch that is selective in removing the dielectric material that provides the protective dielectric spacer 36.

Figure 8B:
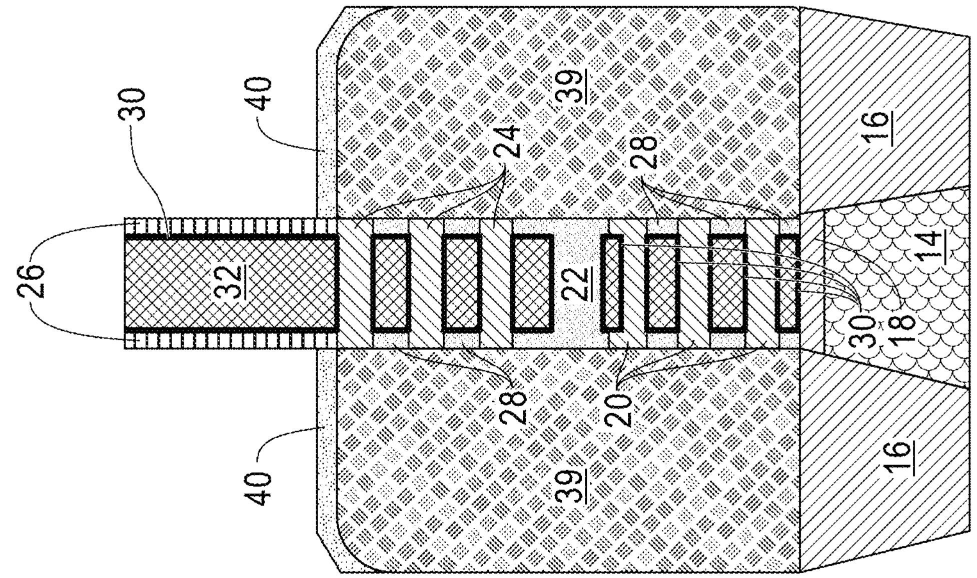
FIGS. 8A-8B are cross sectional views of the stacked nanosheet transistors shown in FIGS. 7A and 7B, respectively, after removing the first block mask in the logic device region, forming a bottom S/D region of a first conductivity type on each side of the bottom nanosheet transistor of the stacked nanosheet transistor in the logic device region, forming a first doped semiconductor region of the first conductivity type on each side of the stacked nanosheet transistor in the passive-diode device region, forming a protective liner on each of the bottom S/D regions and the first doped semiconductor region, and forming a S/D block mask on the protective liner that is present in the logic device region.
Figure 8A:
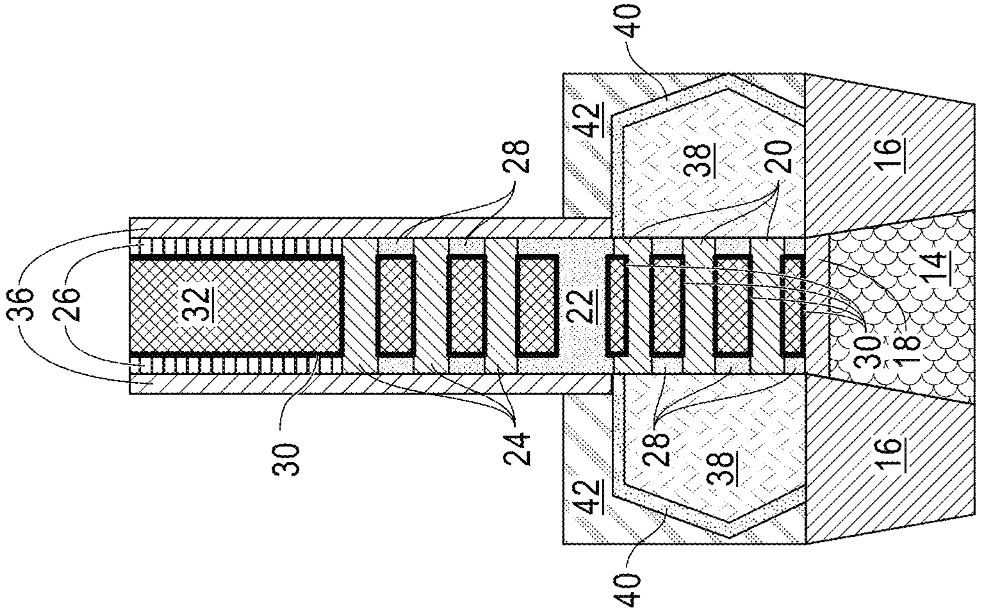

Referring now to FIGS. 8A-8B, there are illustrated the stacked nanosheet transistors shown in FIGS. 7A and 7B, respectively, after removing the first block mask 37 in the logic device region, forming a bottom S/D region 38 of a first conductivity type on each side of the bottom nanosheet transistor of the stacked nanosheet transistor in the logic device region, forming a first doped semiconductor region 39 of the first conductivity type on each side of the stacked nanosheet transistor in the passive-diode device region, forming a protective liner 40 on each of the bottom S/D regions 38 and the first doped semiconductor region 39, and forming a S/D block mask 42 on the protective liner 40 that is present in the logic device region. Protective liner 40 can be referred to herein as first protective liner. The first block mask 37 can be removed utilizing a material removal process such as for example, ashing, that is selective in removing the first block mask 37. In the logic device region, and after removing the first block mask 37, sidewalls of each of the first semiconductor channel material nanosheets 20 are physically exposed, while the sidewalls of each of the second semiconductor channel material nanosheets 24 in the logic device region are protected by the protective dielectric spacer 36. In the passive/diode device region, sidewalls of each of the first semiconductor channel material nanosheets 20 and each of the second semiconductor channel material nanosheets 24 are physically exposed.

The bottom S/D regions 38 and the first doped semiconductor region 39 are then simultaneously formed in their respective device region utilizing an epitaxial growth process or CVD. As used herein, a "S/D" or "source/drain" region can be a source region or a drain region depending on subsequent wiring and application of voltages during operation of the transistor. The bottom S/D regions 38 and the first doped semiconductor region 39 are both composed of a fifth semiconductor material and a dopant. The fifth semiconductor material can include one of the semiconductor materials mentioned above for the first semiconductor layer 10. The fifth semiconductor material can be compositionally the same as, or compositionally different from each of the first semiconductor channel material nanosheets 20 and/or each of the second semiconductor channel material nanosheets 24. The dopant that is present in the bottom S/D regions 38 and the first doped semiconductor region 39 can be either a p-type dopant or an n-type dopant. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium, and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. In one example, each source/drain region can have a dopant concentration of from $4\times10^{20}$ atoms/cm$^3$ to $3\times10^{21}$ atoms/cm$^3$. In one example, the bottom S/D regions 38 and the first doped semiconductor region 39 are both composed of phosphorus doped silicon. The first conductivity type can be either n-type or p-type depending on the type of dopant used in providing the bottom S/D regions 38 and the first doped semiconductor region 39. In the logic device region, the bottom S/D regions 38 grow outward from the physically exposed surface of only the first semiconductor channel material nanosheets 20. In the passive/diode device region, the first doped semiconductor region 39 extends physically outward from the physically exposed surface of the first semiconductor channel material nanosheets 20 and the physically exposed surface of the second semiconductor channel material nanosheets 24. Note that the bottom S/D regions 38 have a height that is less than a height of the first doped semiconductor region 39. In the present application, the height of the bottom S/D regions 38 does not extend beyond a topmost surface of the middle dielectric isolation layer 22, while the height of the first doped semiconductor region 39 is substantially equal to the height of the stacked first and second semiconductor channel material nanosheets.

Protective liner 40 is then formed on each of the bottom S/D regions 38 and the first doped semiconductor region 39. The protective liner 40 can be composed of any dielectric material including for example, silicon oxide, silicon nitride or silicon oxynitride. The protective liner 40 can be a conformal layer and the protective liner 40 can be formed utilizing a deposition process such as, for example, CVD, PECVD or ALD, followed by a recess etch. The protective liner 40 follows the contour of the bottom S/D regions 37 and the first doped semiconductor region 39.

The S/D block mask 42 is then formed on the protective liner 40 that is present in the logic device region. The S/D block mask 42 includes any block mask material, and the S/D block mask 42 can be formed by deposition and lithographic patterning.

Figure 9B:
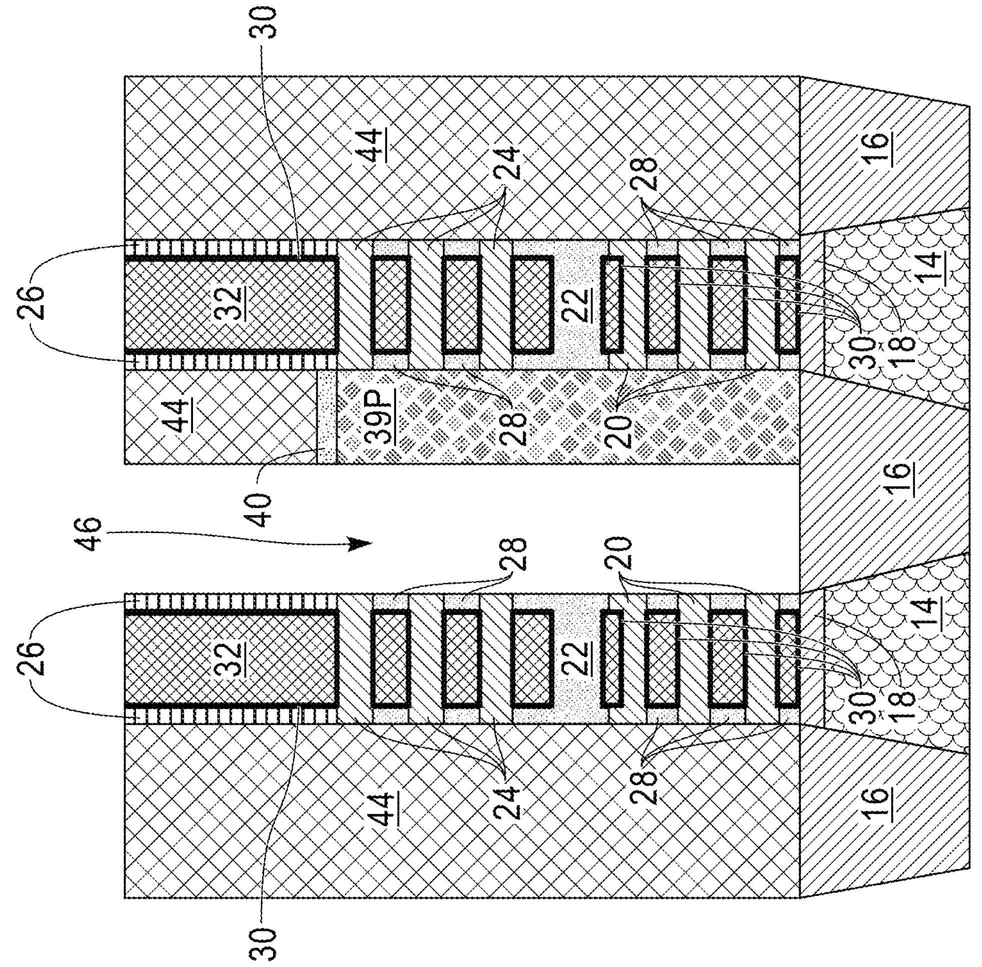
FIGS. 9A-9B are cross sectional views of the stacked nanosheet transistors shown in FIGS. 8A and 8B, respectively, after forming a second block mask in each of the logic device region and the passive/diode device region, opening the second block mask in the passive/diode device region and removing a portion of the first doped semiconductor region that is located between a neighboring pair of stacked nanosheet transistors that are present in the passive/diode device region, wherein a portion of the first doped semiconductor region remains along a sidewall of the stacked nanosheet transistor that is present in the passive/diode device region, this remaining portion of the first doped semiconductor region can be referred to as a first doped semiconductor pillar of the first conductivity type.
Figure 9A:
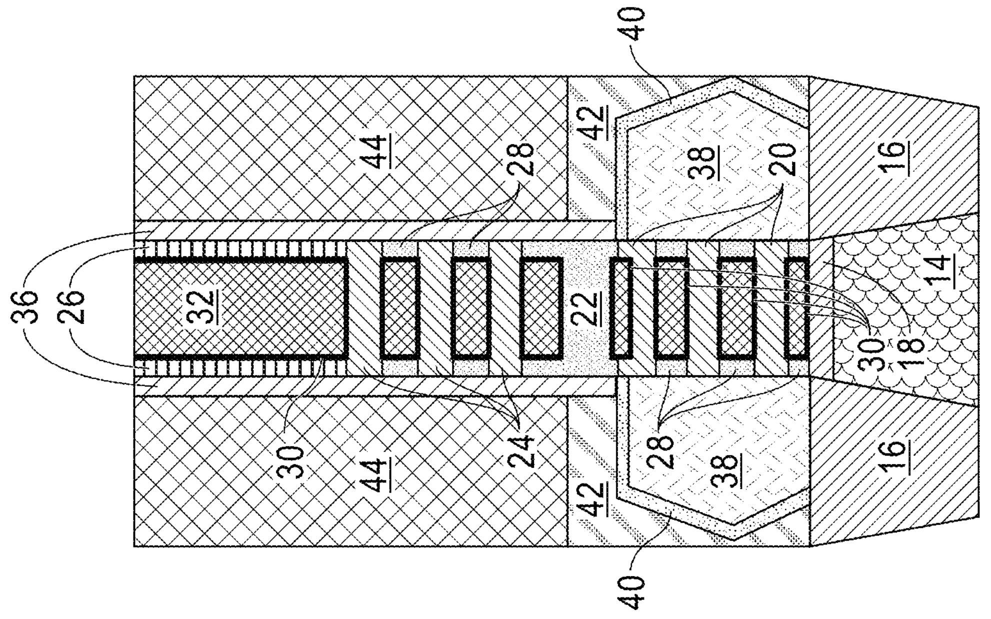

Referring now to FIGS. 9A-9B, there are illustrated the stacked nanosheet transistors shown in FIGS. 8A and 8B, respectively, after forming a second block mask 44 in each of the logic device region and the passive/diode device region, opening the second block mask 44 (and the protective liner 40) in the passive/diode device region and removing a portion of the first doped semiconductor region 39 that is located between a neighboring pair of stacked nanosheet transistors that are present in the passive/diode device region, a portion of the first doped semiconductor region 39 remains along a sidewall of the stacked nanosheet transistor that is present in the passive/diode device region, this remaining portion of the first doped semiconductor region 39 can be referred to as a first doped semiconductor pillar 39P of the first conductivity type. It is noted that two stacked nanosheet transistors are now shown in the passive/diode device region and, for clarity, the first doped semiconductor region 39 is only shown on one side of the stacked nanosheet transistor in the passive/diode device region.

The second block mask 44 is composed of a second block mask material, and the second block mask 44 can be formed by a deposition process such as, for example, spin-on coating. The second block mask material is compositionally different from the block mask material that provides the S/D block mask 42. A portion of the second block mask 44 (and the protective liner 40) in the passive/diode device region is then removed utilizing lithography an etching. This etching process can include a single etch or multiple etching processes can be used. In the illustrated embodiment, this etching process stops on a surface of the shallow trench isolation structure 16.

The removal of the portion of the first doped semiconductor region 39 can be performed utilizing a material removal process such as, for example, an etch, that is selective in removing the first doped semiconductor region 39. This removal steps forms opening 46 adjacent to the first doped semiconductor pillar 39P. The first doped semiconductor pillar 39P of the first conductivity type (n-type or p-type) has a height that is the same as that previously mentioned for the height of the first doped semiconductor region 39.

Figure 10A:
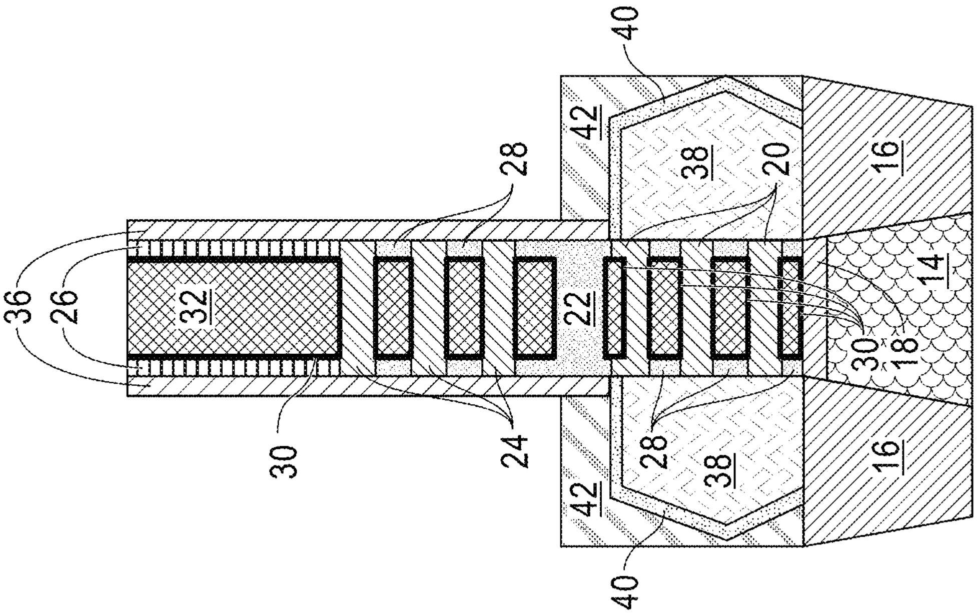
FIGS. 10A-10B are cross sectional views of the stacked nanosheet transistors shown in FIGS. 9A and 9B, respectively, after removing the second block mask, forming an intrinsic semiconductor material adjacent to the first doped semiconductor pillar and forming additional protective liner material adjacent to the remaining protective liner that is present on the first doped semiconductor pillar, wherein the additional protective liner material and the remaining protective liner that is present on the first doped semiconductor pillar collectively form a precursor passive/device protective liner on top of both the intrinsic semiconductor material and the first doped semiconductor pillar.
Figure 10B:
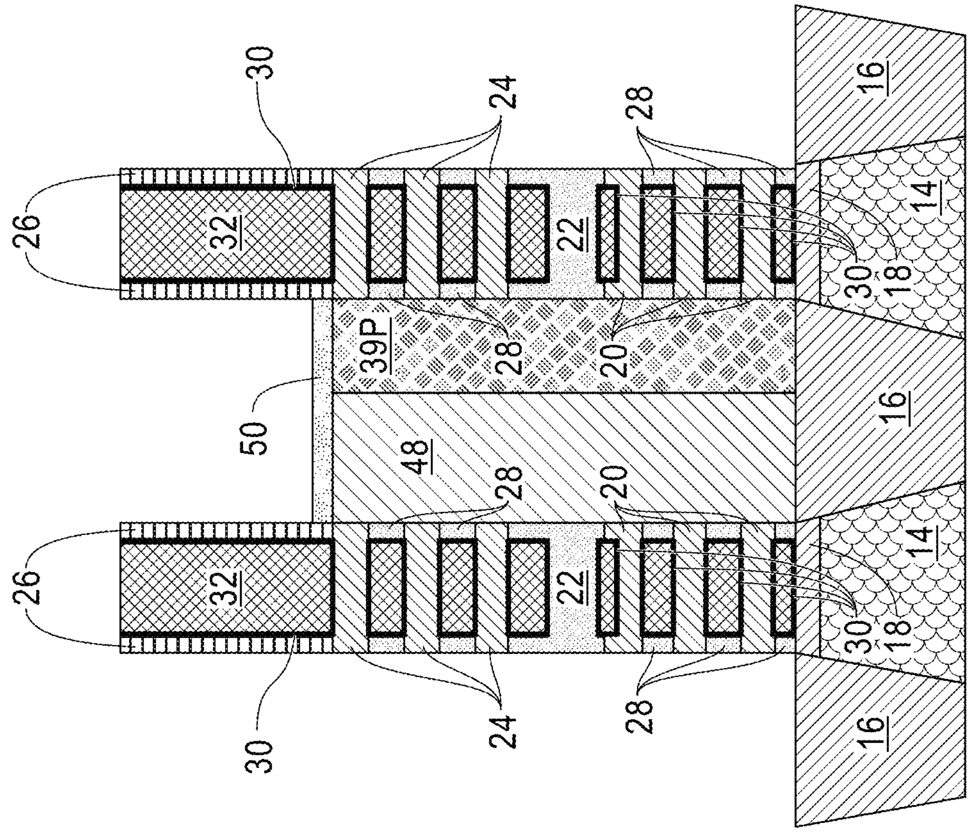

Referring now to FIGS. 10A-10B, there are illustrated the stacked nanosheet transistors shown in FIGS. 9A and 9B, respectively, after removing the second block mask 44, forming an intrinsic semiconductor material 48 adjacent to the first doped semiconductor pillar 39P (and in opening 46) and forming additional protective liner material adjacent to the remaining protective liner 40 that is present on the first doped semiconductor pillar 39P, wherein the additional protective liner material and the remaining protective liner 40 that is present on the first doped semiconductor pillar 39P collectively form a precursor passive/device protective liner 50 on top of both the intrinsic semiconductor material 48 and the first doped semiconductor pillar 39.

The second block mask 44 can be removed utilizing any material removal process such as, for example, ashing, that is capable of removing the second block mask 44 from both the logic device region and the passive/diode device region. Note that the S/D block mask 42 is not removed by this material removal process. The intrinsic semiconductor material 48 is composed of a sixth semiconductor material without the presence of any added dopants. The sixth semiconductor material that provides the intrinsic semiconductor material 48 can be compositionally the same as, or compositionally different from, the fifth semiconductor material used in providing the bottom S/D regions 38 and the first doped semiconductor region 39. The intrinsic semiconductor material 48 can be formed by an epitaxial growth process or by CVD. The intrinsic semiconductor material 48 is formed along the sidewall of the first doped semiconductor pillar 39 and along the sidewall of one of the adjacent stacked nanosheet transistors that are present in the passive/diode device region. The intrinsic semiconductor material 48 can have a sidewall that directly contacts the physically exposed surface of each first semiconductor channel material nanosheet 20 and each second semiconductor channel material nanosheet 24 of this adjacent stacked nanosheet transistors that is present in the passive/diode device region. The intrinsic semiconductor material 48 has a same height as the height of the adjacent first doped semiconductor pillar 39P.

The additional protective liner material can include one of the dielectric materials mentioned above in forming the protective liner 40. The additional protective liner material is typically composed of a same dielectric material as the protective liner 40. The additional protective liner material can be formed by deposition followed by a recess etch. The resultant precursor passive/device protective liner 50 extends entirely between the two adjacent stacked nanosheet transistors that are present in the passive/diode device region and it spans entirely across a topmost surface of both the intrinsic semiconductor material 48 and the first doped semiconductor pillar 39P.

Figure 11B:
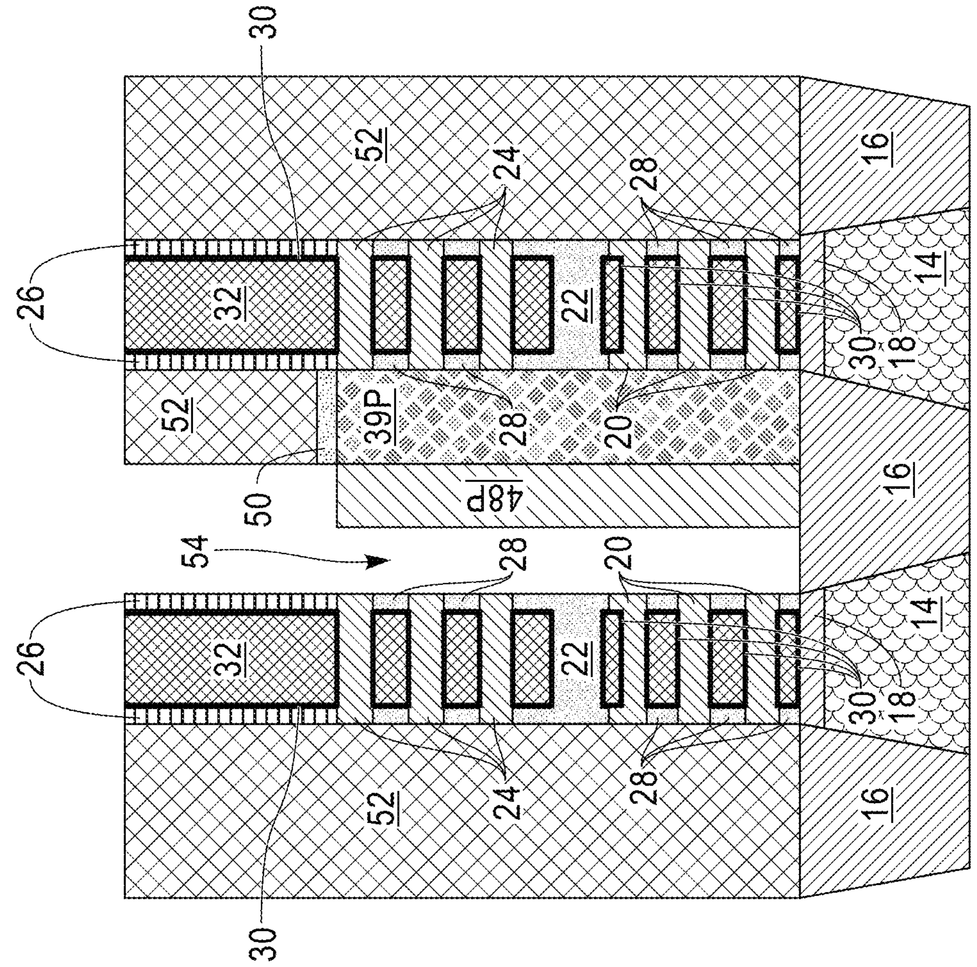
FIGS. 11A-11B are cross sectional views of the stacked nanosheet transistors shown in FIGS. 10A and 10B, respectively, after forming a third block mask in each of the logic device region and the passive/diode device region, opening the third block mask in the passive/diode device region and removing a portion of the intrinsic semiconductor material that is located between the neighboring pair of stacked nanosheet transistors that are present in the passive/diode device region, wherein a portion of the intrinsic semiconductor materials remains along a sidewall of the first doped semiconductor pillar, this remaining portion of the intrinsic semiconductor material can be referred to as an intrinsic semiconductor material pillar.
Figure 11A:
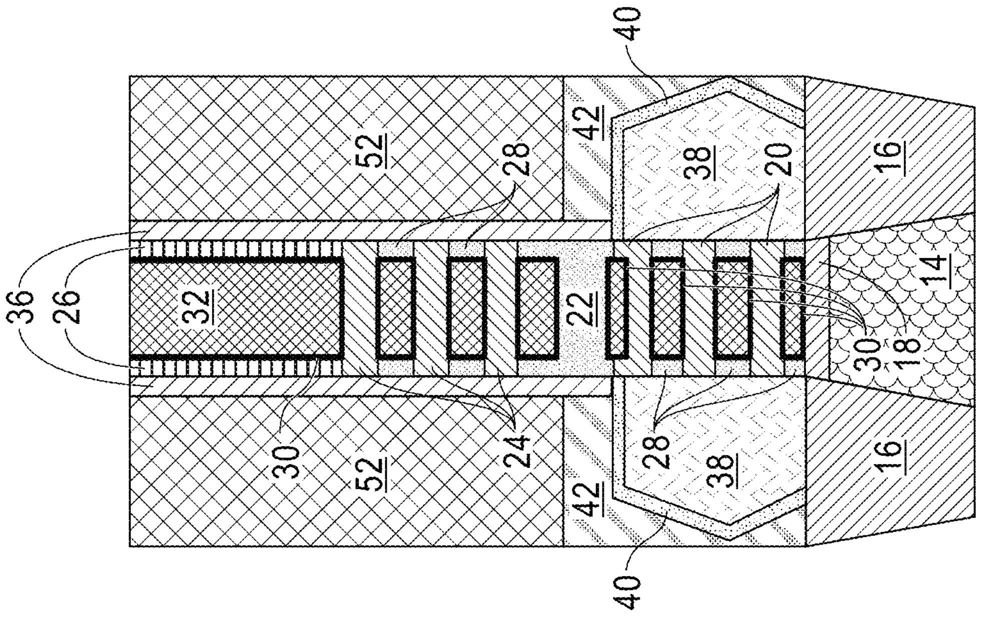

Referring now to FIGS. 11A-11B, there are illustrated the stacked nanosheet transistors shown in FIGS. 10A and 10B, respectively, after forming a third block mask 52 in each of the logic device region and the passive/diode device region, opening the third block mask 52 (and the precursor passive/device protective liner 50) in the passive/diode device region and removing a portion of the intrinsic semiconductor material 48 that is located between the neighboring pair of stacked nanosheet transistors that are present in the passive/diode device region, a portion of the intrinsic semiconductor material 48 remains along a sidewall of the first doped semiconductor pillar 39P, this remaining portion of the intrinsic semiconductor material 48 can be referred to as an intrinsic semiconductor material pillar 48P.

The third block mask 52 is composed of a third block mask material, and the third block mask 52 can be formed by a deposition process such as, for example, spin-on coating. The third block mask material is compositionally different from the block mask material that provides the S/D block mask 42. A portion of the third block mask 52 (and the precursor passive/device protective liner 50) in the passive/diode device region is then removed utilizing lithography an etching. This etching process can include a single etch or multiple etching processes can be used. In the illustrated embodiment, this etching process stops on a surface of the shallow trench isolation structure 16.

The removal of the portion of the intrinsic semiconductor material 48 can be performed utilizing a material removal process such as, for example, an etch, that is selective in removing the intrinsic semiconductor material 48. This removal steps forms opening 54 adjacent to the intrinsic semiconductor material 48. The intrinsic semiconductor material pillar 48P is present a sidewall of the first doped semiconductor pillar 39P and the intrinsic semiconductor material pillar 48P has a same height as the height of the first doped semiconductor pillar 39.

Figure 12B:
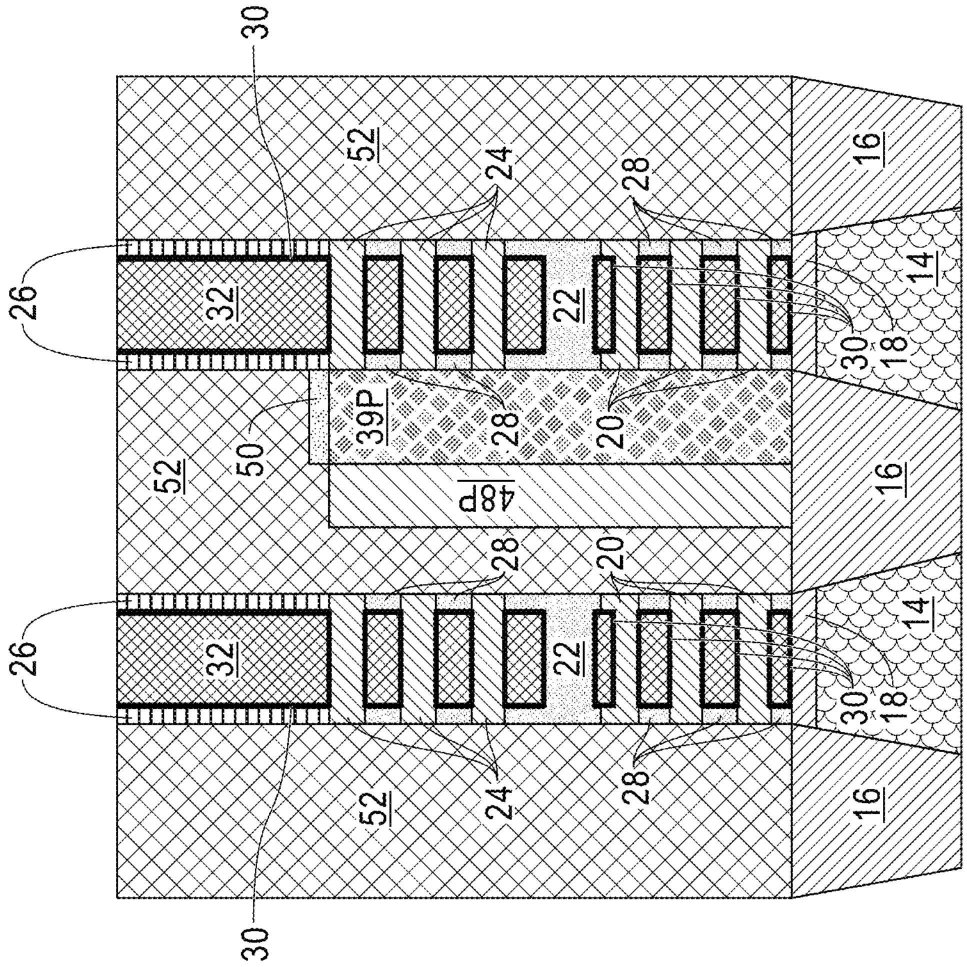
FIGS. 12A-12B are cross sectional views of the stacked nanosheet transistors shown in FIGS. 11A and 11B, respectively, after forming additional third block material to reestablish the third block mask in the passive/diode device region, removing the third block mask for the logic device region, and removing the protective dielectric spacer from the top nanosheet transistor of the stacked nanosheet transistor in the logic device region.
Figure 12A:
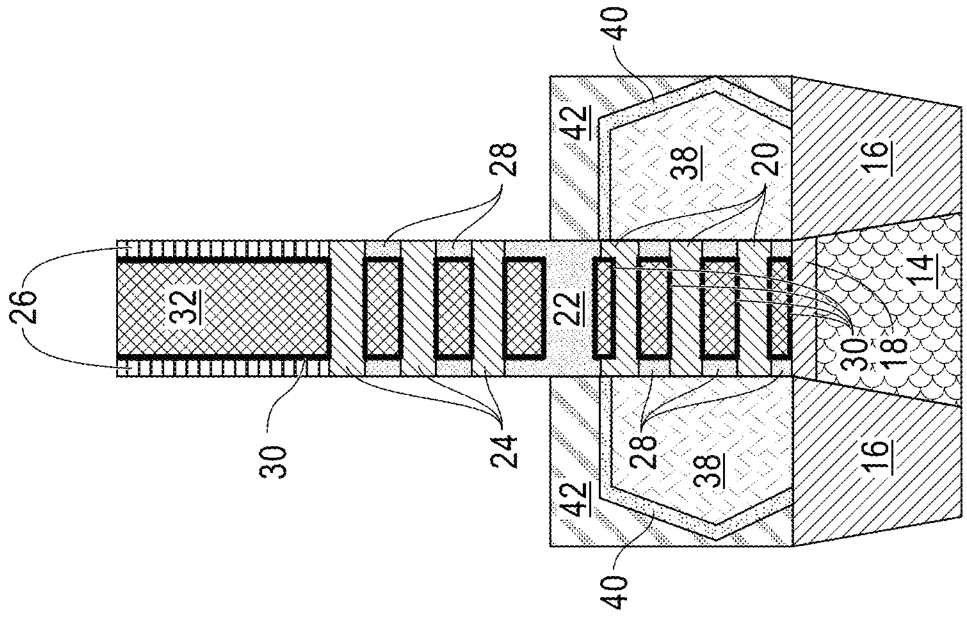

Referring now to FIGS. 12A-12B, there are illustrated the stacked nanosheet transistors shown in FIGS. 11A and 11B, respectively, after forming additional third block material to reestablish the third block mask 52 in the passive/diode device region, removing the third block mask 52 for the logic device region, and removing the protective dielectric spacer 36 from the top nanosheet transistor of the stacked nanosheet transistor in the logic device region. The forming of the additional third block material can include deposition, followed by a planarization process. The removal of the third block mask 52 from the logic device region can include lithography and etching. The removal of the protective dielectric spacer 36 includes a material removal process that is selective in removing the dielectric material that provides the protective dielectric spacer 36. The removal of the protective dielectric spacer 36 from the top nanosheet transistor in the logic device region reveals the sidewalls of each of the second semiconductor channel material nanosheets 24 that are present in the logic device region.

Figure 13B:
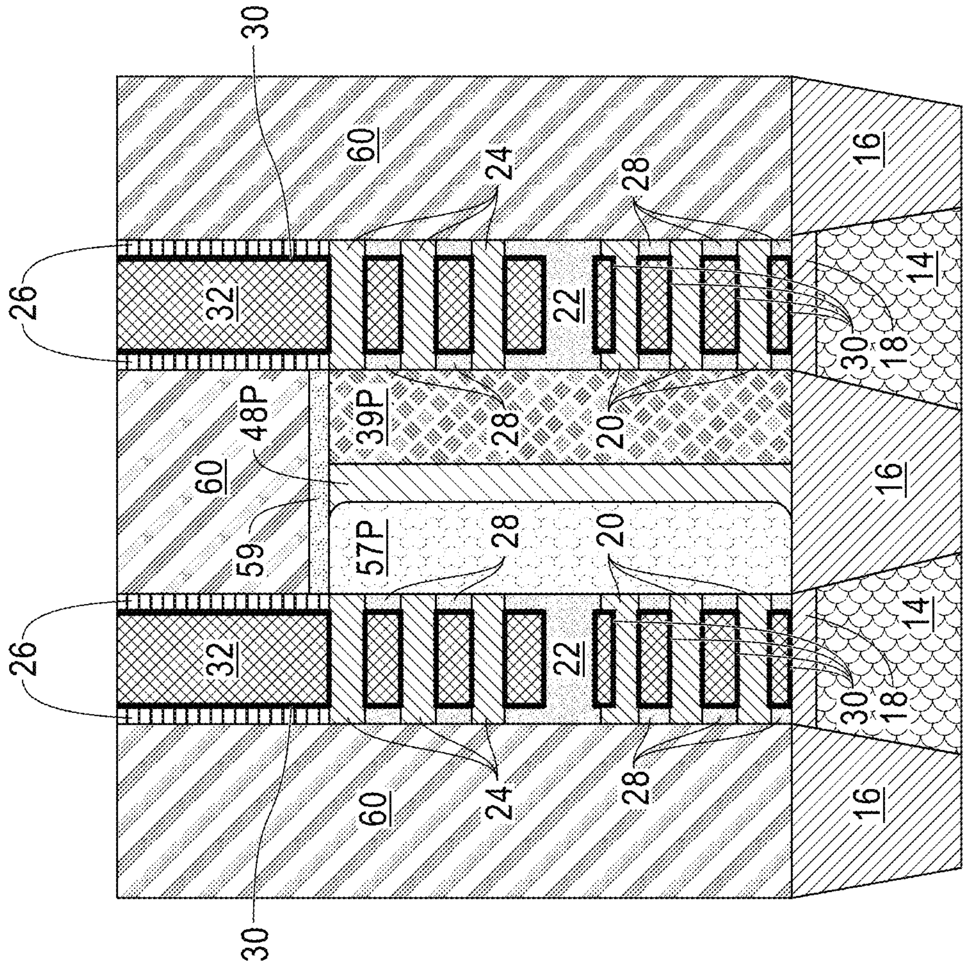
FIGS. 13A-13B are cross sectional views of the stacked nanosheet transistors shown in FIGS. 12A and 12B, respectively, after removing the reestablished third block mask from the passive/diode device region, forming a top S/D region of a second conductivity type on each side of the top nanosheet transistor of the stacked nanosheet transistor in the logic device region, forming a second doped semiconductor pillar of the second conductivity type adjacent to the intrinsic semiconductor pillar, forming a second protective liner on each of the top S/D regions and laterally adjacent to the precursor passive/device protective liner, wherein the second protective liner and the precursor passive/device protective liner in the passive/diode device region collectively form a passive/device protective liner on top of the second doped semiconductor pillar, the intrinsic semiconductor pillar and the first doped semiconductor pillar (these three pillars collectively form a diode in the passive/diode device region), and forming an interlayer dielectric (ILD) layer in each of the logic device region and the passive/diode device region.
Figure 13A:
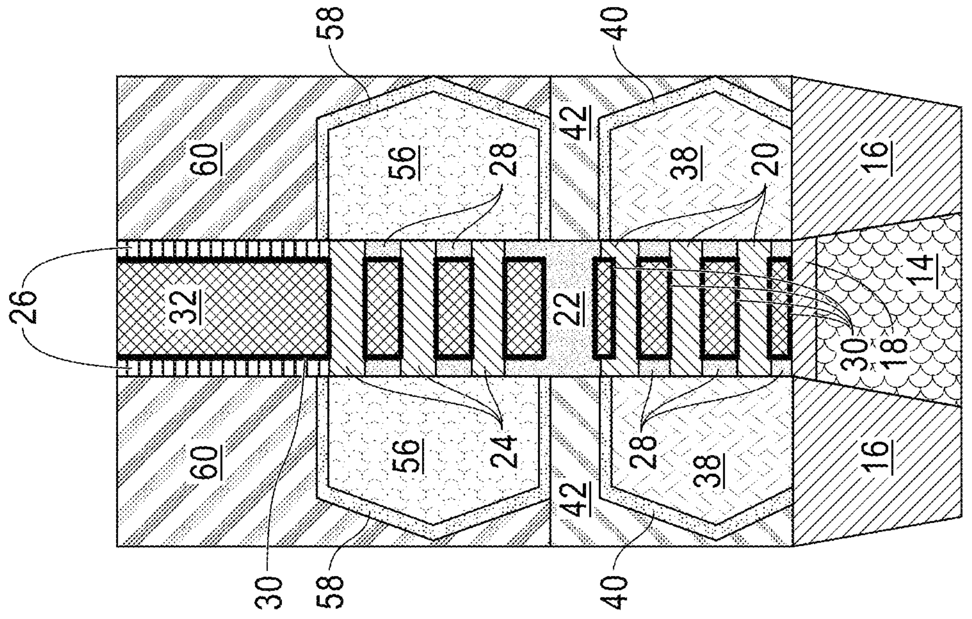

Referring now to FIGS. 13A-13B, there are illustrated the stacked nanosheet transistors shown in FIGS. 12A and 12B, respectively, after removing the reestablished third block mask 52 from the passive/diode device region, forming a top S/D region 56 of a second conductivity type on each side of the top nanosheet transistor of the stacked nanosheet transistor in the logic device region, forming a second doped semiconductor pillar 57P of the second conductivity type adjacent to the intrinsic semiconductor pillar 48P, forming a second protective liner 58 on each of the top S/D regions 56 and laterally adjacent to the precursor passive/device protective line 50, wherein the second protective liner 58 and the precursor passive/device protective liner 50 in the passive/diode device region collectively form a passive/device protective liner 59 on top of the second doped semiconductor pillar 57P, the intrinsic semiconductor pillar 48P and the first doped semiconductor pillar 38P (these three pillars collectively form a diode in the passive/diode device region), and forming an ILD layer 60 in each of the logic device region and the passive/diode device region.

The reestablished third block mask 52 can be removed utilizing any material removal process such as, for example, ashing, that is capable of removing the reestablished third block mask 52 from the passive/diode device region. The top S/D regions 58 and the second doped semiconductor pillar 57P are then simultaneously formed in their respective device region utilizing an epitaxial growth process or CVD. The top S/D regions 58 and the second doped semiconductor pillar 57P are both composed of a seventh semiconductor material and a dopant. The seventh semiconductor material can include one of the semiconductor materials mentioned above for the first semiconductor layer 10. The seventh semiconductor material can be compositionally the same as, or compositionally different from each of the first semiconductor channel material nanosheets 20 and/or each of the second semiconductor channel material nanosheets 24. The dopant that is present in top S/D regions 58 and the second doped semiconductor pillar 57P can be either a p-type dopant or an n-type dopant, provided that the dopant used in providing the top S/D regions 58 and the second doped semiconductor pillar 57P is of an oppositive conductivity type than the dopant used in forming the bottom S/D regions 38 and the first doped semiconductor region 39.

In the logic device region, the top S/D regions 58 grow outward from the physically exposed surface of only the second semiconductor channel material nanosheets 20. In the passive/diode device region, the second doped semiconductor pillar 57P extends physically outward from the physically exposed surface of the first semiconductor channel material nanosheets 20 and the physically exposed surface of the second semiconductor channel material nanosheets 24. The second doped semiconductor pillar 57P has a height that is equal to the height of each of the intrinsic semiconductor material pillar 48P, and the first doped semiconductor pillar 38P.

In this embodiment of the present application, a topmost surface of each of the second doped semiconductor pillar 57P, the intrinsic semiconductor material pillar 48P, and the first doped semiconductor pillar 38P is substantially coplanar with a topmost surface of the topmost second semiconductor channel material nanosheet.

The second protective liner 58 is then formed on each of the top S/D regions 56 and laterally adjacent to the precursor passive/device protective line 50. The second protective liner 58 can be composed of any dielectric material including for example, silicon oxide, silicon nitride or silicon oxynitride. The second protective liner 58 can be a conformal layer and second protective liner 58 can be formed utilizing a deposition process such as, for example, CVD, PECVD or ALD, followed by a recess etch. The second protective liner 58 follows the contour of the top S/D regions 56.

The ILD layer 60 is composed of any an ILD material such as, for example, silicon oxide, silicon nitride, undoped silicate glass (USG), fluorosilicate glass (FSG), borophosphosilicate glass (BPSG), a spin-on low-k dielectric layer, a chemical vapor deposition (CVD) low-k dielectric layer, or any combination thereof. The term “low-k” as used throughout the present application denotes a dielectric material that has a dielectric constant of less than 4.0. The ILD layer 60 can be formed by deposition of the dielectric material (CVD, PECVD or spin-on coating), followed by a planarization process. Planarization can include chemical mechanical polishing (CMP) and/or grinding. ILD layer 60 is formed on the frontside of the structure and hence ILD layer 60 can be referred to as a frontside ILD layer.

Figure 14B:
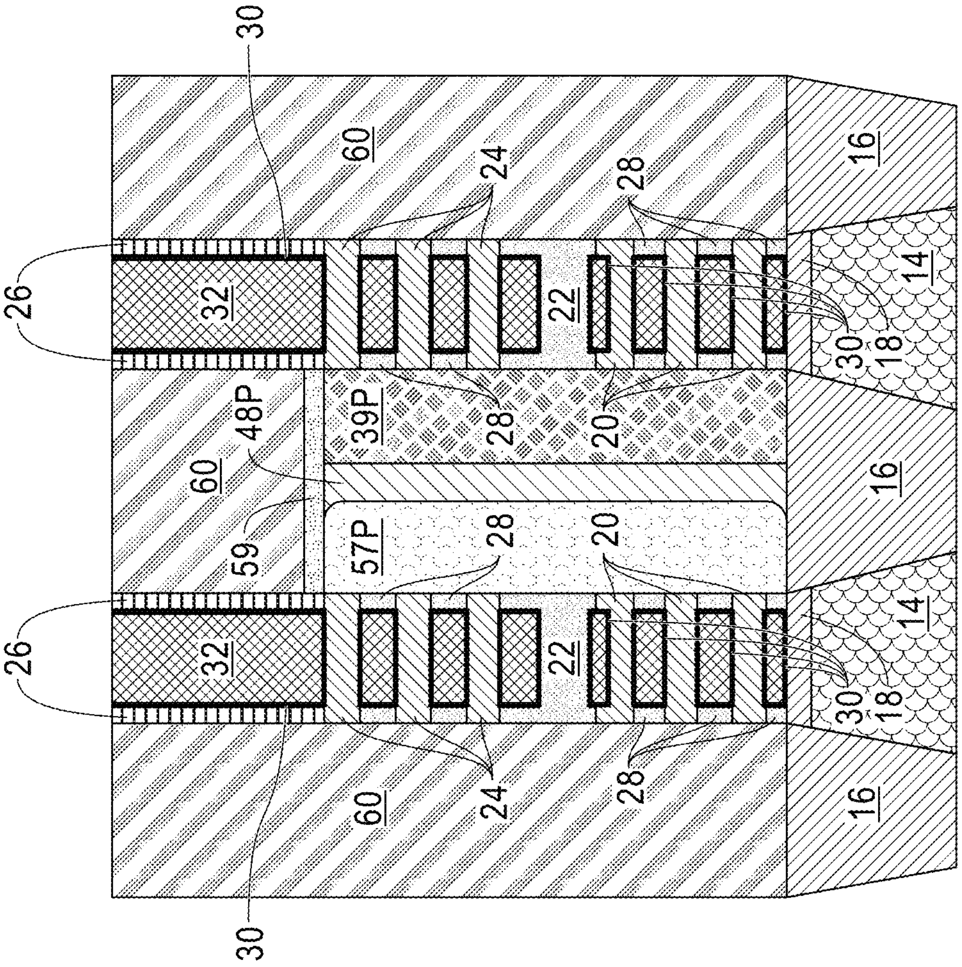
FIGS. 14A-14B are cross sectional views of the stacked nanosheet transistors shown in FIGS. 13A and 13B, respectively, after forming top S/D contact structures in the logic device region.
Figure 14A:
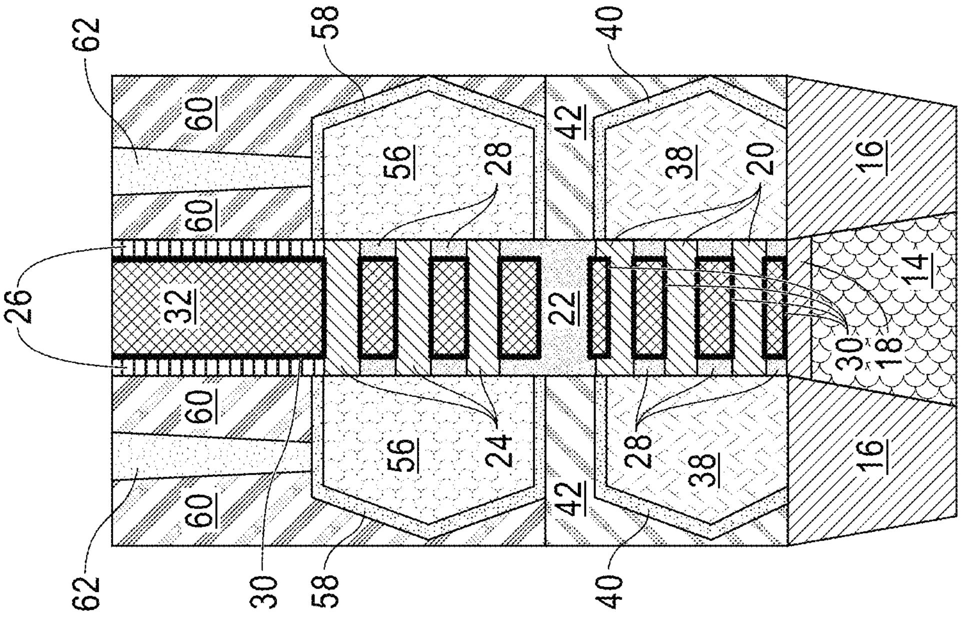

Referring now to FIGS. 14A-14B, there are illustrated the stacked nanosheet transistors shown in FIGS. 13A and 13B, respectively, after forming top S/D contact structures 62 in the logic device region. Top S/D contact structures 62 are formed in the frontside of the structure and thus can be referred to herein as frontside top S/D contact structures. The top S/D contact structures 62 are formed through the ILD layer 60 and the second protective liner 58 and contact a surface of the top S/D regions. The top S/D contact structures 62 can be formed by a metallization process. The metallization process includes forming contact openings in the ILD layer 60 and the second protective liner 58 and then filling (including deposition and planarization) those contact openings with at least a contact conductor material. The contact conductor material that can be used for providing the frontside contact structures includes, for example, a silicide liner, such as Ni, Pt, NiPt, an adhesion metal liner, such as TiN, and conductive metals such as W, Cu, Al, Co, Ru, Mo, Os, Ir, Rh, or an alloy thereof. The frontside contact structures can also include one or more contact liners (not shown). In one or more embodiments, the contact liner (not shown) can include a diffusion barrier material. Exemplary diffusion barrier materials include, but are not limited to, Ti, Ta, Ni, Co, Pt, W, Ru, TiN, TaN, WN, WC, an alloy thereof, or a stack thereof such as Ti/TiN and Ti/WC. In one or more embodiments in which a contact liner is present, the contact liner (not shown) can include a silicide liner, such as Ti, Ni, NiPt, etc., and a diffusion barrier material, as defined above.

Figure 15B:
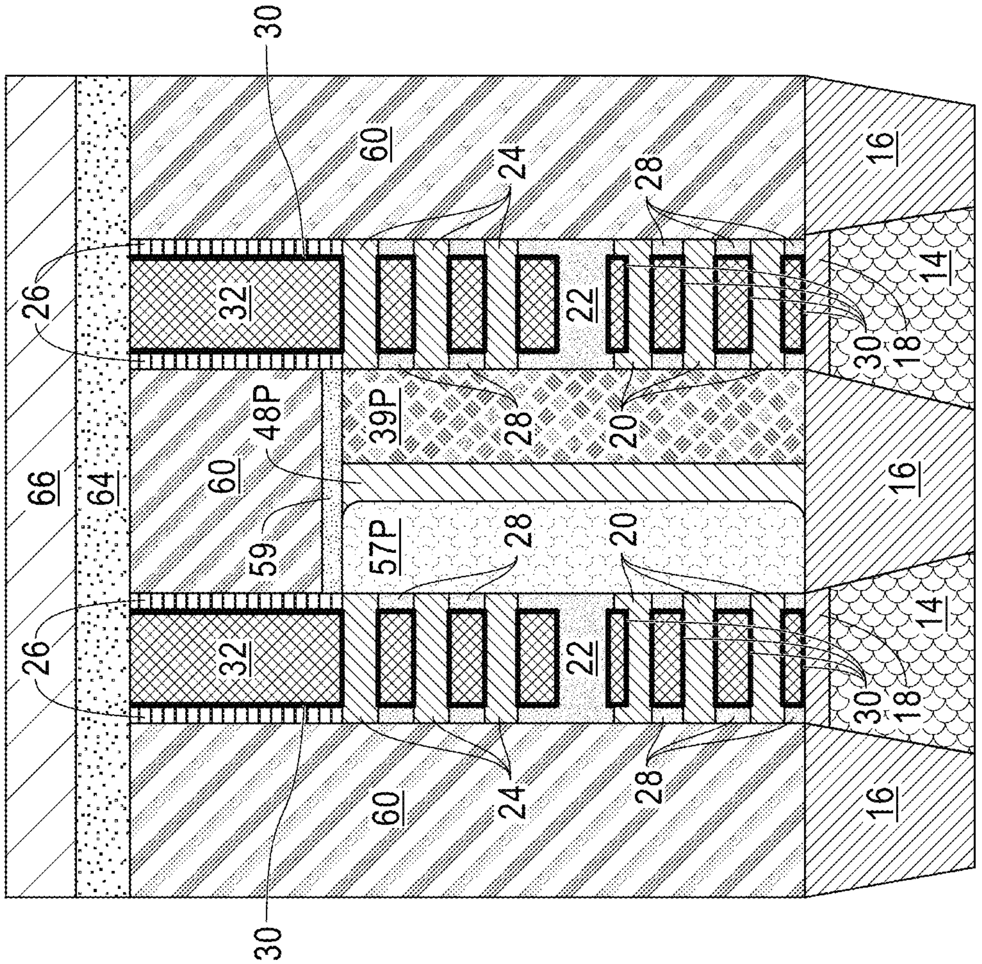
FIGS. 15A-15B are cross sectional views of the stacked nanosheet transistors shown in FIGS. 14A and 14B, respectively, after forming a frontside back-end-on-the-line (BEOL) structure and a carrier wafer in each of the logic device region and the passive/diode device region.
Figure 15A:
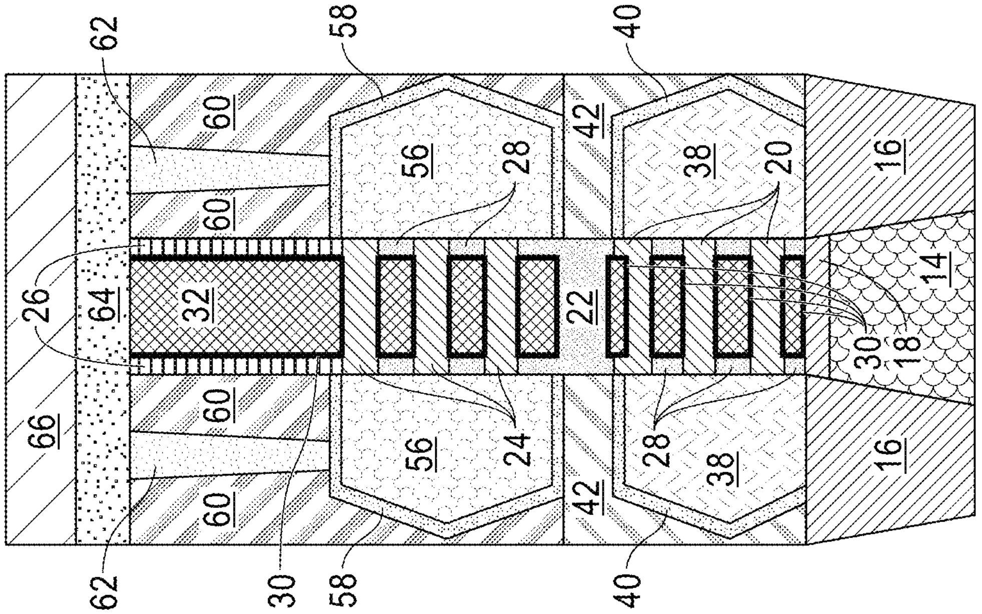

Referring now to FIGS. 15A-15B, there are illustrated the stacked nanosheet transistors shown in FIGS. 14A and 14B, respectively, after forming a frontside BEOL structure 64 and a carrier wafer 66 in each of the logic device region and the passive/diode device region. The frontside BEOL structure 64 is formed on the uppermost surface of the ILD layer 60. The frontside BEOL structure 64 can include one or more interconnect dielectric material layers (including one of the dielectric materials mentioned above for the ILD layer 60) that contain frontside metal wires (the metal wires can be composed of any electrically conductive metal or electrically conductive metal alloy) embedded therein. In the logic device region, electrical contact of the frontside BEOL structure 64 to each top S/D contact structure 62 is made.

The carrier wafer 66 can include one of the semiconductor materials mentioned above for the first semiconductor layer 10. Carrier wafer 66 is bonded to the frontside BEOL structure 64 after frontside BEOL structure 64 formation. This concludes the frontside processing of the semiconductor device of the present application.

Figure 16B:
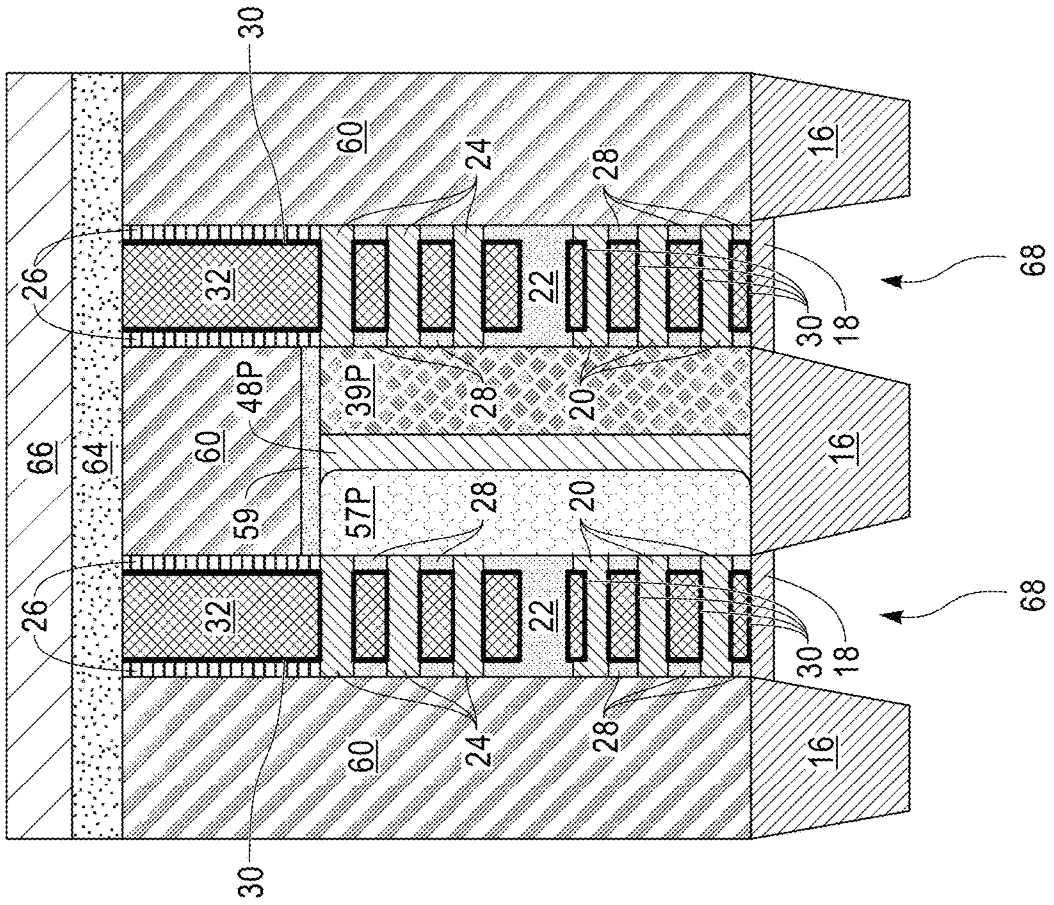
FIGS. 16A-16B are cross sectional views of the stacked nanosheet transistors shown in FIGS. 15A and 15B, respectively, after removing the substrate from each of the logic device region and the passive/diode device region.
Figure 16A:
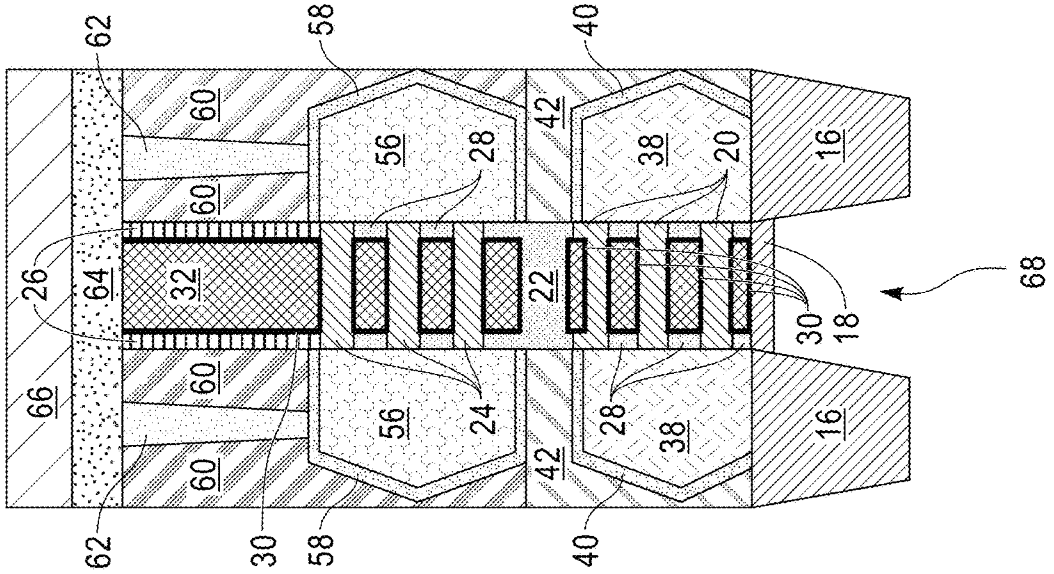

Referring now to FIGS. 16A-16B, there are illustrated the stacked nanosheet transistors shown in FIGS. 15A and 15B, respectively, after removing the substrate from each of the logic device region and the passive/diode device region. The removal of the substrate typically includes flipping the wafer 180° to physically expose a backside of the substrate. This flipping step is not shown in the drawings of the present application for clarity. The flipping physically exposes the bottommost surface of the substrate, e.g., the first semiconductor layer 10, and will allow backside processing of the exemplary structure. Flipping can be performed by hand or by utilizing a mechanical means such as, for example, a robot arm. The removal of the physically exposed first semiconductor layer 10 physically exposes the etch stop layer 12. The removal of the first semiconductor layer 10 can be performed utilizing a material removal process that is selective in removing the first semiconductor material that provides the first semiconductor layer 10. The step can be omitted in embodiments in which the substrate does not include first semiconductor layer 10. The removal of the etch stop layer 12 includes a material removal process that is selective in removing the etch stop layer 12. The removal of the etch stop layer 12 physically exposes the second semiconductor layer 14. This removal step can be omitted if the etch stop layer 12 is not present. The second semiconductor layer 14 can be removed utilizing a material removal process that is selective in removing that layer from the structure. The removal of the substrate forms backside openings 68 that physically expose a bottommost surface of the bottom dielectric isolation layer 18. The backside openings 68 are typically flanked on each side by shallow trench isolation structure 16.

Figure 17A:
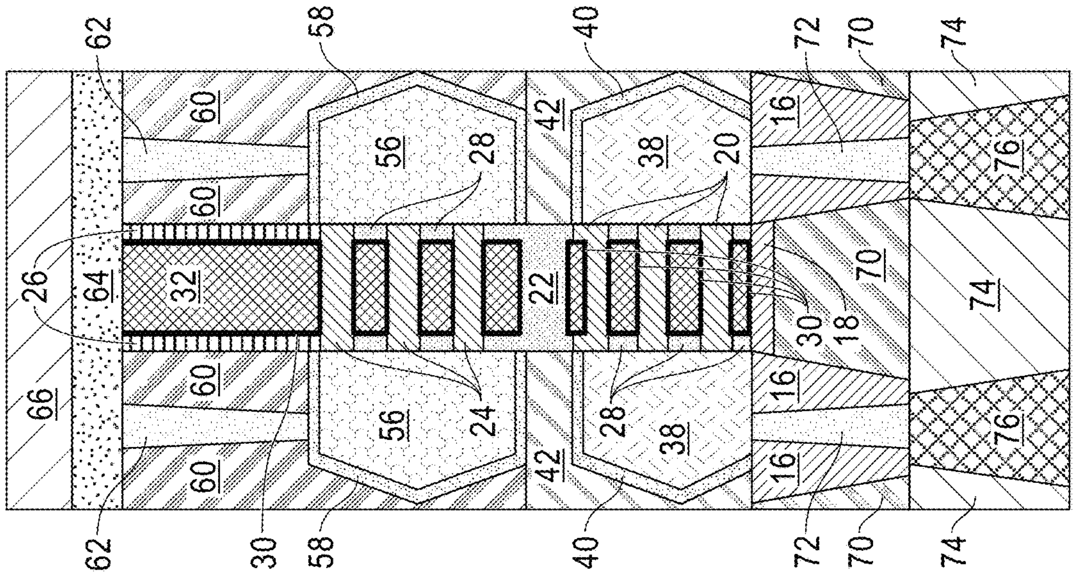

Referring now to FIGS. 17A-17B, there are illustrated the stacked nanosheet transistors shown in FIGS. 16A and 16B, respectively, after further backside processing. Further backside processing can include forming a first backside ILD layer 70 in each of the backside openings 68 and embedding each shallow trench isolation structure 16. The first backside ILD layer 70 can include one of the ILD materials mentioned above for the ILD layer 60. The first backside ILD layer 70 can include one of the ILD materials mentioned above for the ILD layer 60. The first backside ILD layer 70 can be formed utilizing the technique mentioned above in forming the ILD layer 60. Next, backside contact structures can be formed. In the present application and in the logic device region, bottom S/D contact structures 72 are formed; since the bottom S/D contact structures 72 are formed on the backside of the structure, they can be referred to as backside bottom S/D contact structures. In the present application and in the passive/diode device region, a pair of backside diode contact structures 73 are formed. In the present application, of the backside diode contact structures 73 contacts the second doped semiconductor pillar 57P and the other backside diode contact structure 73 contacts the first doped semiconductor pillar 39P. The backside contact structures can be formed by a metallization process in which backside contact openings are formed through the shallow trench isolation structures 16 and then these backside contact openings are filled with materials as mentioned above in forming the top S/D contact structures 62.

Next, a second backside ILD layer 74 including backside metal structures 76 are formed. The second backside ILD layer 74 can include one of the ILD materials mentioned above for the ILD layer 60. The second backside ILD layer 74 can include one of the ILD materials mentioned above for the ILD layer 60. The second backside ILD layer 74 can be compositionally the same as, or compositionally different from the first backside ILD layer 70. The second backside ILD layer 74 can be formed utilizing the technique mentioned above in forming the ILD layer 60. The backside metal structures 76 can includes materials as mentioned above in forming the top S/D contact structures 62. The backside metal structure 76 can be formed utilizing a damascene process or by a subtractive etch process. In the present application, and in the logic device region, the backside metal structures 76 are in contact with the bottom S/D contact structures 72. In the present application, and in the passive/diode device region, the backside metal structures 76 are in contact with the backside diode contact structures 73.

Referring now to FIG. 18, there is illustrated a semiconductor structure in accordance with another embodiment illustrating only the passive/diode device region. A logic device region similar to the one shown in FIG. 17A would be located adjacent to the passive/diode device region illustrated in FIG. 18. Although the structure in FIG. 18 is not illustrated as containing a frontside BEOL structure and a carrier wafer the same are present on the structure. The illustrated structure shown in FIG. 18 can be formed utilizing the basic processing steps shown in FIGS. 1A-17B however in this case no intrinsic semiconductor pillar is formed. Instead, a diode in which a first doped semiconductor pillar 39P sandwiched between a pair of second doped semiconductor pillars 57P is formed. In this embodiment, a frontside diode contact structure 78 is formed in contact the first doped semiconductor pillar 39P and bottom S/D contact structures 72A, 72B are formed in contact with each of the second doped semiconductor pillars 57P.

Referring now to FIG. 19, there is illustrated semiconductor structure in accordance with yet another embodiment illustrating only the passive/diode device region. A logic device region similar to the one shown in FIG. 17A would be located adjacent to the passive/diode device region illustrated in FIG. 19. Although the structure in FIG. 19 is not illustrated as containing a frontside BEOL structure and a carrier wafer the same are present on the structure. The illustrated structure shown in FIG. 18 can be formed utilizing the basic processing steps shown in FIGS. 1A-17B however in this case no intrinsic semiconductor pillar is formed. Instead, a bottom diode including a first doped bottom semiconductor pillar 39*b* of the first conductivity type and a second doped bottom semiconductor pillar 57*b* of the second conductivity is formed, wherein the first doped bottom semiconductor pillar and the second doped bottom semiconductor pillar are in direct physical contact with each other is formed. The structure further includes a top diode located above and spaced apart from the bottom diode, wherein the top diode includes a first doped top semiconductor pillar 39*u* of the first conductivity type and a second doped top semiconductor pillar 57*u* of the second conductivity type, wherein the first doped top semiconductor pillar and the second doped top semiconductor pillar are in direct physical contact with each other is formed. In this embodiment, a first frontside diode contact structure 80A is formed in contact the second doped top semiconductor pillar 57*u* and a second frontside diode contact structure 80B is formed in contact the first doped top semiconductor pillar 39*u*. Also, and in this embodiment, a first backside diode contact structure 73A is formed in contact with the second doped bottom semiconductor pillar 57*b* and a second frontside diode contact structure 83B is formed in contact the first doped bottom semiconductor pillar 39*b*. These contact structure of this embodiment of the present application are composed of materials and can be formed by techniques previously mentioned herein.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:

a diode located in a passive/diode device region and present between two adjacent stacked nanosheet transistors, wherein the diode comprises a first doped semiconductor pillar of a first conductivity type and a second doped semiconductor pillar of a second conductivity type that is opposite the first conductivity type, and an intrinsic semiconductor pillar located laterally between the first doped semiconductor pillar and the second doped semiconductor pillar, and the diode including each of the first doped semiconductor pillar, the intrinsic semiconductor pillar and the second doped semiconductor pillar lands on a surface of a shallow trench isolation structure;

a first backside contact structure contacting the first doped semiconductor pillar; and a second backside contact structure contacting the second doped semiconductor pillar.

2. The semiconductor structure of claim 1, wherein the first doped semiconductor pillar directly contacts a sidewall of a first stacked nanosheet transistor of the two adjacent stacked nanosheet transistors, and the second doped semiconductor pillar directly contacts a sidewall of a second stacked nanosheet transistor of the two adjacent stacked nanosheet transistors.

3. The semiconductor structure of claim 1, wherein the diode has a height that is substantially equally to a topmost second semiconductor channel material nanosheet of the two adjacent stacked nanosheet transistors.

4. The semiconductor structure of claim 1, further comprising a first backside metal structure contacting the first backside contact structure, and a second backside metal structure contacting the second backside contact structure, wherein the first backside contact structure and the second backside contact structure are present in a first backside interlayer dielectric (ILD) layer, and the first backside metal structure and the second backside metal structure are present in a second backside ILD layer.

5. The semiconductor structure of claim 1, further comprising a frontside back-end-of-the-line (BEOL) structure located on top of the two adjacent stacked nanosheet transistors.

6. The semiconductor structure of claim 1, further comprising at least one other stacked nanosheet transistor located in a logic device region that is adjacent to the passive/diode device, wherein the at least one other stacked nanosheet transistor comprises a bottom nanosheet transistor having bottom source/drain regions of the first conductivity type, and a top nanosheet transistor located above the bottom nanosheet transistor and having top source/drain regions of the second conductivity type.

7. The semiconductor structure of claim 6, wherein the top source/drain regions are spaced apart from the bottom source/drain regions by at least a S/D block mask.

8. The semiconductor structure of claim 6, further comprising a frontside top S/D contact structure contacting each of the top source/drain regions, and a backside bottom S/D contact structure contacting each of the bottom source/drain regions.

9. A semiconductor structure comprising:

a diode located in a passive/diode device region and present between two adjacent stacked nanosheet transistors, wherein the diode comprises a first doped semiconductor pillar of a first conductivity type sandwiched between a pair of second doped semiconductor pillars of a second conductivity type that is opposite the first conductivity type, and the diode including each of the first doped semiconductor pillar, and the pair of second doped semiconductor pillars lands on a surface of a shallow trench isolation structure;

a first backside contact structure contacting one of the second doped semiconductor pillars;

a second backside contact structure contacting another of the second doped semiconductor pillars; and a frontside contact structure contacting the first doped semiconductor pillar.

10. The semiconductor structure of claim 9, wherein one of the second doped semiconductor pillars directly contacts a sidewall of a first stacked nanosheet transistor of the two adjacent stacked nanosheet transistors, and another of the second doped semiconductor pillar directly contacts a sidewall of a second stacked nanosheet transistor of the two adjacent stacked nanosheet transistors.

11. The semiconductor structure of claim 9, wherein the diode has a height that is substantially equally to a topmost second semiconductor channel material nanosheet of the two adjacent stacked nanosheet transistors.

12. The semiconductor structure of claim 9, further comprising a first backside metal structure contacting the first backside contact structure, and a second backside metal structure contacting second backside contact structure, wherein the first backside contact structure and the second backside contact structure are present in a first backside interlayer dielectric (ILD) layer, and the first backside metal structure and the second backside metal structure are present in a second backside ILD layer.

13. The semiconductor structure of claim 9, further comprising a frontside back-end-of-the-line (BEOL) structure located on top of the two adjacent stacked nanosheet transistors.

14. The semiconductor structure of claim 9, further comprising at least one other stacked nanosheet transistor located in a logic device region that is adjacent to the passive/diode device, wherein the at least one other stacked nanosheet transistor comprises a bottom nanosheet transistor having bottom source/drain regions, and a top nanosheet transistor located above the bottom nanosheet transistor and having top source/drain regions.

15. A semiconductor structure comprising:

a bottom diode located in a passive/diode device region and present between two adjacent stacked nanosheet transistors, wherein the bottom diode comprises a first doped bottom semiconductor pillar of a first conductivity type and a second doped bottom semiconductor pillar of a second conductivity type that is opposite the first conductivity type, wherein the first doped bottom semiconductor pillar and the second doped bottom semiconductor pillar are in direct physical contact with each other, and the bottom diode including each of the first doped bottom semiconductor pillar and the second doped bottom semiconductor pillar lands on a surface of a shallow trench isolation structure;

a top diode located above and spaced apart from the bottom diode, wherein the top diode comprises a first doped top semiconductor pillar of the first conductivity type and a second doped top semiconductor pillar of the second conductivity type, wherein the first doped top semiconductor pillar and the second doped top semiconductor pillar are in direct physical contact with each other;

a first backside contact structure contacting the first doped bottom semiconductor pillar;

a second backside contact structure contacting the second doped bottom semiconductor pillar;

a first frontside contact structure contacting the first doped top semiconductor pillar; and a second frontside contact structure contacting the second doped top semiconductor pillar.

16. The semiconductor structure of claim 15, wherein the bottom diode is located laterally adjacent to a bottom nanosheet transistor of each of the two adjacent stacked nanosheet transistors, and the top diode is located laterally adjacent to a top nanosheet transistor of each of the two adjacent stacked nanosheet transistors.

17. The semiconductor structure of claim 15, further comprising a first backside metal structure contacting the first backside contact structure, and a second backside metal structure contacting second backside contact structure, wherein the first backside contact structure and the second backside contact structure are present in a first backside interlayer dielectric (ILD) layer, and the first backside metal structure and the second backside metal structure are present in a second backside ILD layer.

* * * * *